US005570305A

United States Patent [19]
Fattouche et al.

[11] Patent Number: 5,570,305
[45] Date of Patent: Oct. 29, 1996

[54] METHOD AND APPARATUS FOR THE COMPRESSION, PROCESSING AND SPECTRAL RESOLUTION OF ELECTROMAGNETIC AND ACOUSTIC SIGNALS

[76] Inventors: Michel Fattouche, 156 Hawkwood Blvd., N.W., Calgary, Alberta, Canada, T2E 2T2; Hatim Zaghloul, 402 First Avenue, N.E., Calgary, Alberta, Canada, T2E 0B4

[21] Appl. No.: 173,627

[22] Filed: Dec. 22, 1993

[51] Int. Cl.⁶ .............................. G06F 7/00; G06F 15/00
[52] U.S. Cl. .................. 364/715.02; 364/735; 455/72; 382/167
[58] Field of Search ................... 364/485, 482, 364/484, 487, 553, 572, 576, 580, 726, 829, 715.02

[56] References Cited

U.S. PATENT DOCUMENTS

| | | | |
|---|---|---|---|
| 2,999,925 | 9/1961 | Thomas | 375/76 |
| 3,428,917 | 2/1969 | Voelcker, Jr. | 332/103 |
| 3,497,818 | 2/1970 | Martens et al. | 328/165 |
| 3,508,155 | 4/1970 | Voelcker, Jr. | 455/202 |
| 3,510,640 | 5/1970 | Voelcker, Jr. | 364/853 |
| 3,543,009 | 11/1970 | Voelcker, Jr. | 364/724.16 |
| 3,562,505 | 2/1971 | Barlow, Jr. | 364/735 |
| 4,161,628 | 7/1979 | McRae | 370/17 |
| 4,270,208 | 5/1981 | MacDavid | 375/76 |
| 4,382,160 | 5/1983 | Gosling et al. | 395/2.2 |
| 4,422,459 | 12/1983 | Simson | 128/702 |
| 4,521,749 | 6/1985 | Lockhart | 332/120 |
| 4,559,602 | 12/1985 | Bates, Jr. | 364/487 |
| 4,619,002 | 10/1986 | Thro | 455/226 |
| 4,707,659 | 11/1987 | Kunz et al. | 324/309 |
| 4,750,205 | 6/1988 | Lee et al. | 380/9 |
| 4,860,010 | 8/1989 | Iwamatsu | 341/118 |
| 4,899,367 | 2/1990 | Sampei | 375/39 |
| 4,995,006 | 2/1991 | Huenemann et al. | 364/485 |
| 5,025,456 | 6/1991 | Ota et al. | 375/76 |

OTHER PUBLICATIONS

H. B. Voelcker, "Toward a Unified Theory of Modulation—Part II: Zero Manipulation," *Proceedings of the IEEE*, vol. 54, No. 3, May 1966, pp. 735–755.

H. B. Voelcker, "Toward a Unified Theory of Modulation—Part I: Phase–Envelope Relationships," *Proceedings of the IEEE*, vol. 54, No. 3, Mar. 1966, pp. 340–351.

G. B. Lockhart & Y. O. Al–Jalili, "Analysis and simulation of a hybrid modulation scheme for embedding data in amplitude–modulated signals," *IEEE Proceedings–I*, Oct. 1991, vol. 138, No. 5, pp.426–499.

G. B. Lockhart, T. Bayes, A. A. A. Mehdi & Y. O. Al–Jalili, "Experimental Study of a Modulation Scheme for Embedding Data in DSB–AM," pp. 310–313.

(List continued on next page.)

*Primary Examiner*—Roy N. Envall, Jr.
*Assistant Examiner*—Emmanuel L. Moise
*Attorney, Agent, or Firm*—Limbach & Limbach L.L.P

[57] ABSTRACT

A signal that may be represented by a band limited periodic function m(t) is transformed into its z-domain zeros using characteristics of the signal in the neighbourhood of fades of the signal, namely a bounds of the fades and the depths of the fades. The z-domain zeros are the zeros of the function in the complex plane, and represent local minimums of the function. The z-domain zeros are used to estimate the discrete spectrum of m(t), and the differential phase of m(t) is derived from the envelope of m(t) using the concept of the z-domain zeros. Also, speech is compressed based on the z-domain zeros of a signal m(t) that represents a speech signal, and knowledge of the location of fades is used in interference reduction at single moving antennas by applying a spectral resolution technique during a fade and applying notch filters to the signal to resolve the signal components.

40 Claims, 16 Drawing Sheets

Microfiche Appendix Included
(4 Microfiche, 226 Pages)

OTHER PUBLICATIONS

A. A. G. Requicha, "The Zeros of Entire Functions: Theory and Engineering Applications," *Proceedings of the IEEE*, vol. 68, No. 3, Mar. 1980, pp. 308–328.

B. F. Logan, Jr., "Information in the Zero Crossings of Bandpass Signals," *The Bell System Technical Journal*, vol. 56, No. 4, Apr. 1977, p. 487.

L. R. Morris, "The Role of Zero Crossings in Speech Recognition and Processing," *1972 Conference on Speech Communication and Processing*, Conference Record, Apr. 24–26, 1972, pp. 446–450.

F. E. Bond & C. R. Cahn, "On Sampling the Zeros of Bandwidth Limited Signals," *IRE Transactions on Information Theory*, vol. IT–4, No. 3, Sep. 1958, pp. 110–113.

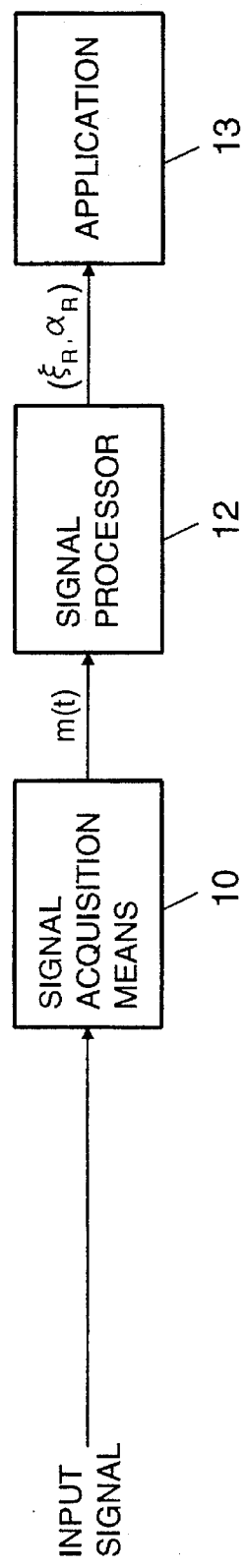
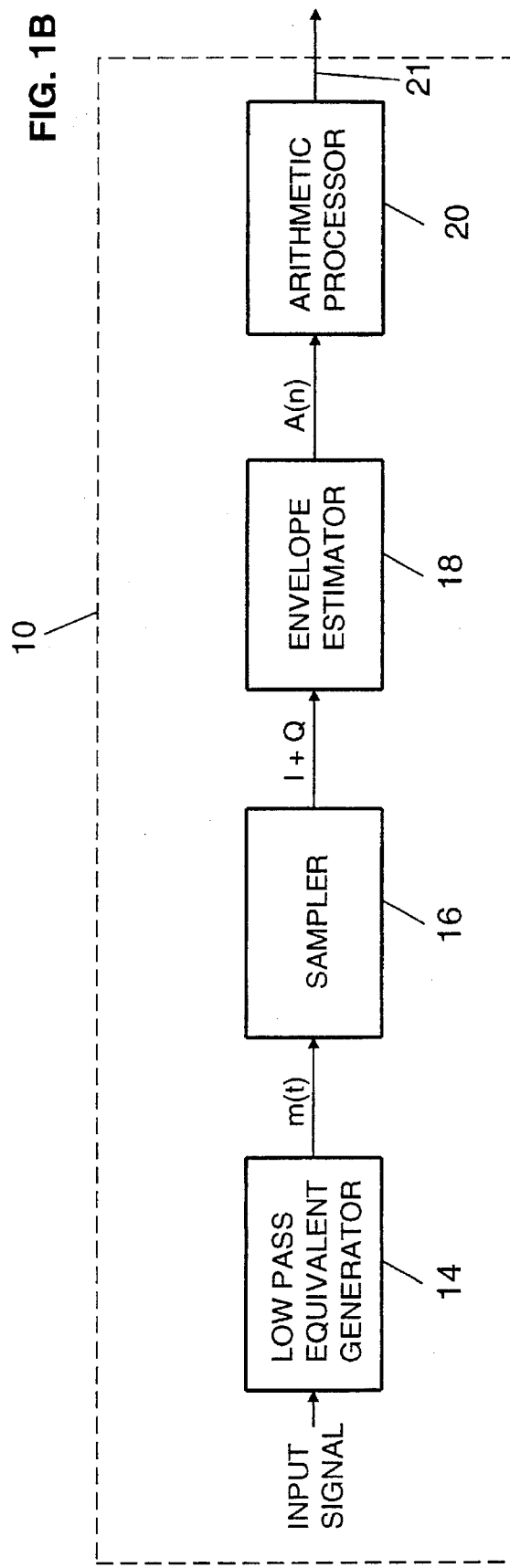

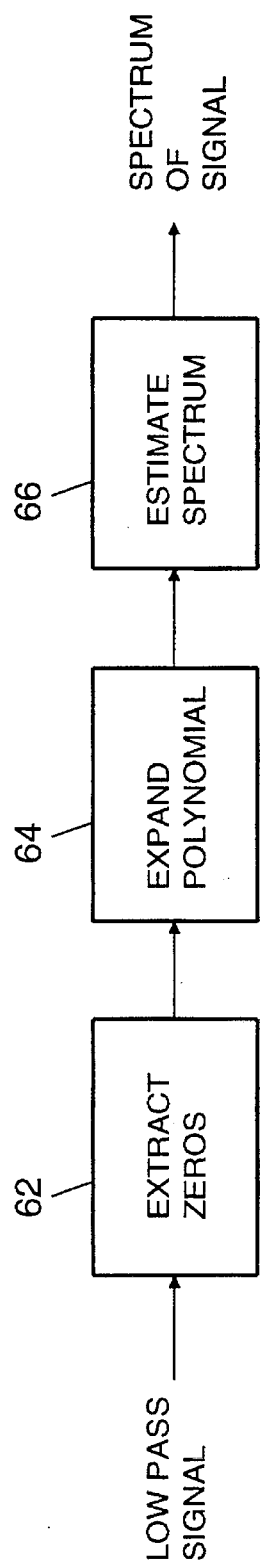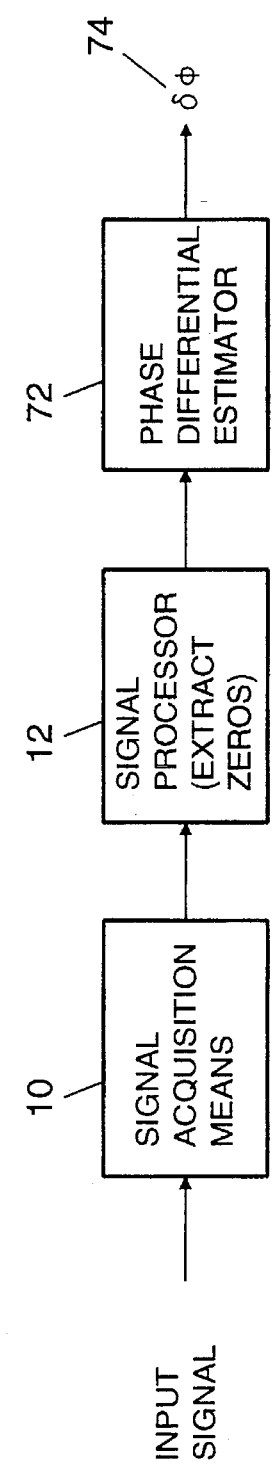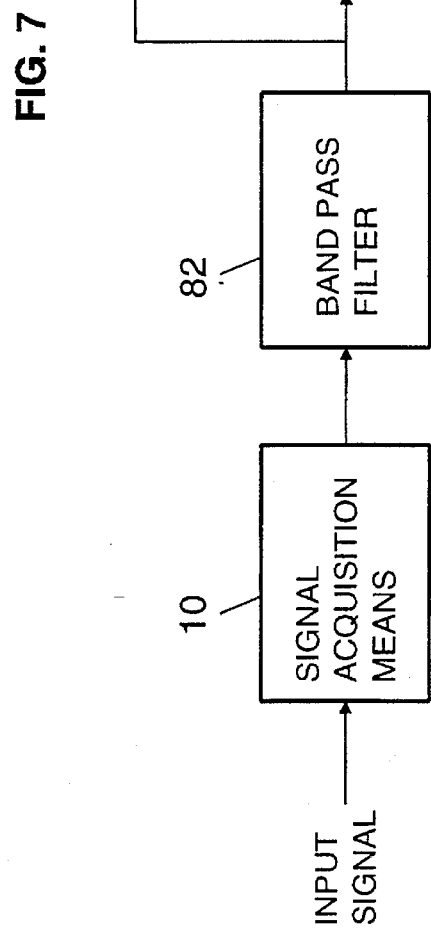

METHOD AND APPARATUS FOR THE COMPRESSION, PROCESSING AND SPECTRAL RESOLUTION OF ELECTROMAGNETIC AND ACOUSTIC SIGNALS

FIELD OF THE INVENTION

This invention relates to the processing of electromagnetic and acoustic signals and in particular to a method and apparatus for transforming one electromagnetic or acoustic signal into a compressed signal.

REFERENCE TO MICROFICHE APPENDIX

This application includes a microfiche appendix consisting of four microfiche with 226 total frames.

CLAIM TO COPYRIGHT

A portion of the disclosure of this patent document contains material which is subject to copyright protection. The copyright owner has no objection to the facsimile reproduction by anyone of the patent document, as it appears in the Patent and Trademark Office patent file or records, but otherwise reserves all copyright rights whatsoever.

BACKGROUND AND SUMMARY OF THE INVENTION

General Technological Background of the Invention

When signals, particularly but not always electromagnetic signals, are used in technological applications, the signal is received at a receiver as a time dependent signal and characteristics of the signal carry information that will often represent a physical quantity. The characteristics of the signal that are used to carry the information may be, for example, the magnitude of the signal at a time instant, or the phase of the signal, or the magnitude of a frequency component of the signal. In using the phase of a signal to carry information, the differential phase of the signal may be used for the sake of efficiency.

After the signal is received at a receiver it is processed. The processing of the signal may be carried out in hardware specifically designed for the purpose, or it may be carried out in a general purpose computer that has been programmed for that particular purpose.

Within the processing hardware, or the general purpose computer, the received signal is processed in the form of a time series of electric signals, which may be either analog (continuous data) or digital (discontinuous data). The received signal will be represented during processing by numerical values that correspond to physical characteristics of the signal, which in turn will have physical significance in the outside world. For example, a received signal may be an electromagnetic signal that represents a person's voice and that is being transmitted by radio. The received signal may be processed first, for example to remove interference effects, and then reconstituted and applied to a loudspeaker and converted into sound waves. Or the received signal may be a seismic signal, representative of an earthquake at some remote location, which is processed as analog or digital data and then displayed in a seismograph.

The processing of the signal may be represented by mathematical models. The models include transforms that operate on the data values of the signal being processed to produce a new set of transformed data values, which in turn represent a physical characteristic of the signal. The transformed signal may then be used in a variety of applications. One extremely well known transformation is the Fourier transform, which essentially resolves a time based signal into its frequency components. Knowledge of the frequency components of an electromagnetic signal can be useful in an enormous range of applications, including analysis of seismic waves, radio transmission and data compression.

The invention described in this patent documents relates in one aspect of the invention to the transformation of a signal into a transformed signal that is specified by the fades of the signal. The received signal will be described by the notation m(t), indicating that the signal is time dependent, and the transformed signal will be described by the notation M(f). These are conventional notations, and it will be appreciated that the parameter t can be replaced by any other suitable parameter having similar ordering properties. In order to calculate the locations and depths of the fades, the signal is first acquired and the low pass equivalent of the input signal is generated to expose the fades.

Where the envelope of the low pass equivalent signal m(t) is below some pre-determined threshold, such as a given number of decibels, for example 15 dB, below the running mean of the envelope of the signal, is referred to in this patent document as a fade of the signal m(t). this patent document, m(t) is compressed into a new signal characterized, in one aspect of the invention, by the locations of fades of the signal, and in another aspect also by the depths of the fades of the signal.

The fades of the signal m(t) correspond to z-domain (complex) zeros of the signal. In general, the zeros (real and complex) of a BL (band limited) function m(t) can be regarded as characteristics with a significance similar to that of the Nyquist samples or of the Fourier series coefficients of m(t). The purely real zeros of a real function correspond to the conventional zero axis crossing and therefore can be easily extracted through a simple zero crossing procedure. A complete discussion of the use of real zeros can be found in U.S. Pat. No. 3,510,640 to Voelker and the references found therein. By contrast, the z-domain zeros are the zeros of the function in the complex plane, and represent local minimums of the envelope of the function.

The z-domain zeros may be used to estimate the discrete spectrum of m(t), and the differential phase of m(t) may be derived from the envelope of m(t) using the concept of the z-domain zeros. Also, speech may be compressed based on the z-domain zeros of a signal m(t) that represents a speech signal, and knowledge of the location of fades may be used in interference reduction at single moving antennas.

The Concept of the Z-domain Zeros Explained

When an input signal m(t) is a BL periodic function, it can be represented by its Fourier series expansion as follows (Eqtn. 1)
where $\omega=2\pi/T$, T is the period of m(t) and $c_k$, the Fourier coefficients of m(t), are equal to M(k/T) for $$m(t) = \sum_{k=-M_1}^{M_2} c_k e^{jk\omega t}$$

$k=-M_1, \ldots, M_2$, M(f) being the Fourier transform of m(t) which is limited to the band $[-M_1/T, M_2/T]$.

In the processing of an input signal in accordance with one aspect of the invention, $e^{j\omega t}$ in Eqtn 1 is replaced by $z^{-1}$ to obtain (Eqtn 2)

$$m(z) = \sum_{k=-M_1}^{M_2} c_k z^{-k}$$

The negative sign in $e^{-j\omega t}$ makes m(z) the z-transform of "M(k/T)" for k=$-M_1$ to $M_2$. From the fundamental theorem of algebra, m(z) can be factorized as (Eqtn 3)

$$m(z) = c_{-M_1} z^{M_1} \prod_{k=1}^{N} (1 - z^{-1} z_k)$$

where $z_k$ is the $k^{th}$ z-domain zero and $N=M_1+M_2$. By substituting $e^{-j\omega t}$ for z in m(z) in Eqtn 3, i.e. by evaluating m(z) around the unit circle in a clockwise manner, m(t) may be expressed as (Eqtn 4)

$$m(t) = c_{-M_1} e^{-jM_1 \omega t} \prod_{k=1}^{N} (1 - \alpha_k e^{j\omega(t-\zeta_k)})$$

where $\alpha_k$ and $(-\omega\zeta_k)$ are the amplitude and the phase of $z_k$ respectively.

The z-domain zeros $z_k$ from k=1 to N of m(z) in Eqtn 3 are transparent to any scaling or frequency shifting of m(t), and can be made transparent to any time shift of m(t) through ordering. Also, m(t) can be either real or complex, and the number N of zeros is always a minimum. By choosing to represent m(t) using its z-domain zeros instead of using Voelcker's real zeros, we trade simplicity (of zero extraction) for a more concise and useful representation, for example in some applications such as spectral estimation, differential phase estimation and speech compression.

There is therefore provided in one aspect of the invention a method of transforming a received input signal into a compressed signal specified by the locations of the fades in one aspect and the depths of the fades in another aspect of the invention, which signal may then be stored, for example as location and depth differentials, for later use. The low pass equivalent of the input signal is generated and then processed to reveal the depths and locations of the fades. Fades having a depth below a given threshold may be ignored. The depth and location of the fades are preferably determined by a parametric procedure according to one aspect of the invention. The signal may be pre-processed by differentiation to reveal hidden zeros (corresponding to non-observable local minimums of the function).

In one aspect of the invention, the locations of the fades may be used to estimate phase differentials of the input signal, and these differentials may be stored for subsequent use or further processed.

In a further aspect of the invention, the locations and depths of the fades may be used to construct a polynomial whose zeros correspond to the fades. The polynomial may be expanded and the coefficients of the resulting expansion may be used as an estimate of the frequency spectrum of the input signal.

The processing of the signal to locate a fade also has application to reception of a clustered incoming signal at a mobile radio. This aspect of the invention may be referred to as virtual angle diversity. Virtual angle diversity has application for cellular communications, where it is assumed in IS-54[1], the North-American interim standard for digital cellular communications, that transmitted radio waves often reach the antenna of the receiver under the form of two independent clusters of incoming rays, which may interfere with one another and make the received signal inadequate without further processing. Such interference may be reduced at a base station using more than one antenna (antenna diversity), or at a slow moving mobile station by accurately estimating the characteristics of each cluster during a frame using both the synchronization and the verification symbols contained in the frame and using these estimates to combine the clusters in an optimal fashion. However, for a fast moving mobile (>25 km/hr for a wavelength of 35 cm), the channel changes too rapidly within one frame to allow accurate channel estimates over the entire frame, and using more than one antenna at the mobile is impractical.

Thus, in this aspect of the invention, knowledge of the location of at least one fade may be used in resolving between two or more different sinusoids received by a transceiver, by applying a spectral estimation technique to the signal during a fade, which resolved sinusoids may then be recombined after filtering to remove one or more of the sinusoids using a notch filter. Using this implementation of the invention, the movement of a mobile transceiver moving at greater than 25 Km/hr may make the mobile transceiver act as if it had more than one antenna, which may allow incoming clusters to be resolved, thereby avoiding interference between the two clusters.

In a further aspect of the invention, the locations and depths of the fades are quantized and the quantized values transmitted. If the input signal is speech, the segments of the compressed signal may be quantized according to whether the segment is voiced or unvoiced.

In a still further aspect of the invention, apparatus for processing an input signal is provided comprising: input signal acquisition means having a first output signal corresponding to the low pass equivalent of the input signal; and processing means connected to receive the first output signal for locating the fades of the input signal and constructing a compressed signal comprising the locations of the fades.

In a still further aspect of the invention, the apparatus includes a quantizer forming part of the processing means to quantize the compressed signal.

In a still further aspect of the invention, the apparatus includes a transmitter connected to the processing means.

In a still further aspect of the invention, the processing means includes means to determine the depth of each fade, and in a still further aspect means to differentiate the acquired signal.

In a still further aspect of the invention, the apparatus includes means to estimate the spectrum of the input signal, and in the case when the input signal is composed of first and second signals having first and second distinct frequencies, further includes first and second notch filters having notches at the first and second distinct frequencies and each being connected to receive the compressed signal; and means to combine output from the first and second notch filters.

The apparatus may also include a differential phase estimator to estimate the phase differentials of the input signal.

BRIEF DESCRIPTION OF THE DRAWINGS

There will now be described a preferred embodiment of the invention, with reference to the drawings, by way of illustration:

FIG. 1A is a schematic showing the basic components of one aspect of the invention;

FIG. 1B is a schematic showing a signal acquisition means for use in the invention;

FIG. 6 is a schematic showing spectral estimation using the techniques of one aspect of the invention;

FIG. 7 is a schematic showing apparatus for carrying out differential phase estimation according to one aspect of the invention;

FIG. 8 is a schematic showing apparatus for carrying out adjusting of an input signal for phase distortion due to flat fading according to one aspect of the invention;

There will also be found in the microfiche appendix to this patent document a set of computer programs that represent implementations of the method of the invention in a general purpose computer. Such programs may be used, in conjunction with an EPROM (erasable programmable read only memory) to program a digital signal processor (commonly commercially available) to carry out the invention.

DETAILED DESCRIPTION OF PREFERRED EMBODIMENTS

Figure 1C:
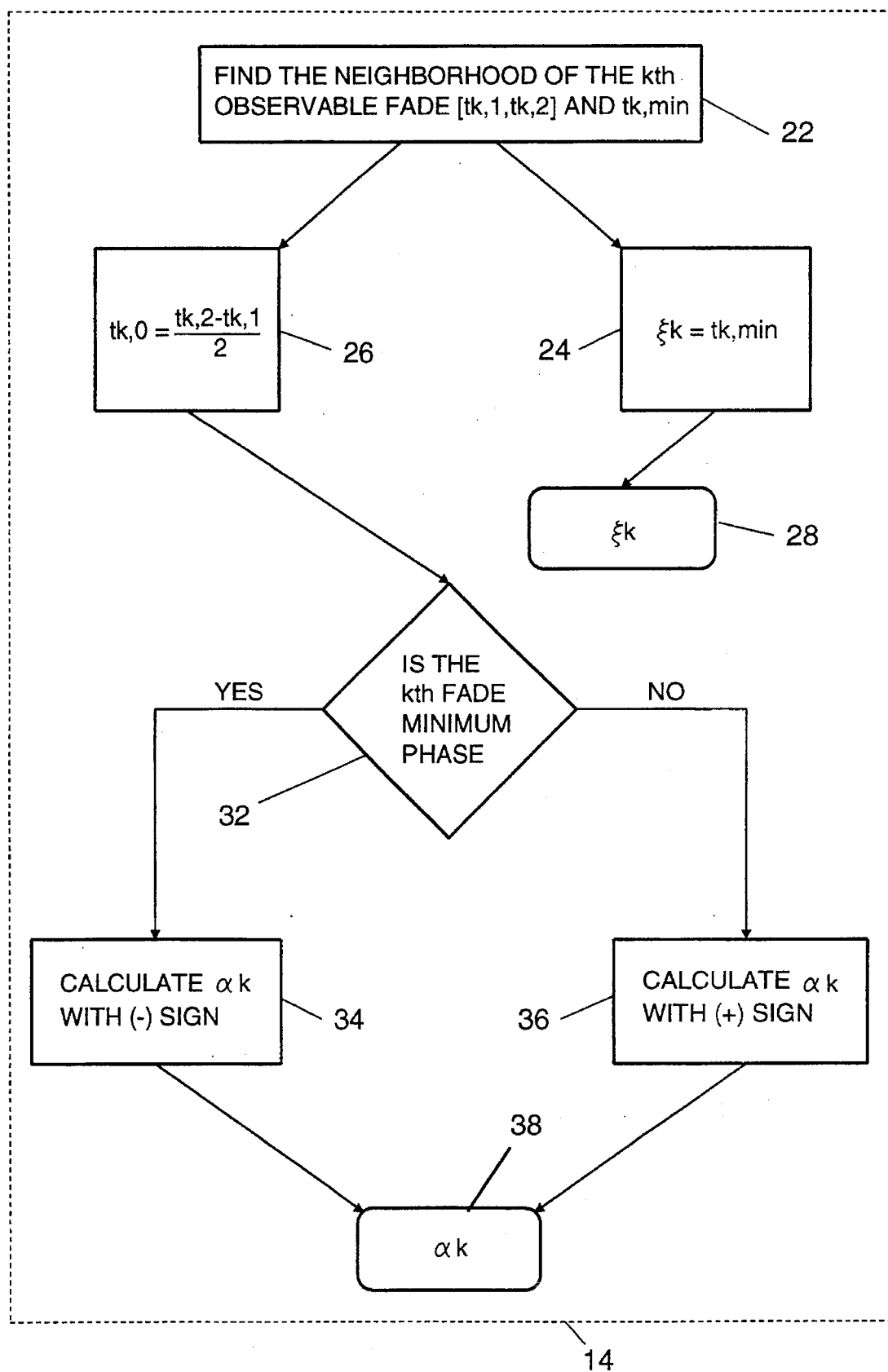
FIG. 1C is a schematic showing signal processing to extract the locations and depths of the fades of an input signal according to one aspect of the invention.

Referring to FIGS. 1A, 1B and 1C, an input signal m(t) is first acquired using signal acquisition means 10, which includes a low pass equivalent generator, and then processed by processor 12 to yield a compressed signal formed of data points corresponding to the locations and depths of the fades of the input signal. The compressed signal may then be used in a variety of further applications, as indicated by the box 13, such as spectral estimation, speech transmission, diversity and differential phase estimation. The application may consist of transmission and reconstruction of the input signal from the compressed signal.

The signal acquisition means 10 may include an antenna (not shown) or other signal receiving device such as a microphone in the case of acquisition of a speech signal, low pass equivalent generator 14, sampler 16, envelope estimator 18 and arithmetic processor 20. An input signal is received at the antenna or other like means and passed to low pass equivalent generator 14. Low pass equivalent generators are well known and described for example in An Introduction to Analog and Digital Communications, by Simon Haykin, Wiley & Sons, New York, 1989. The output of the low pass equivalent generator 14 is passed to sampler 16. Samplers (for example, analog to digital converters), antennas and other like devices are well known in the art and need not be described here. Sampler 16 samples finite segments of the input (carrier) signal at or above the Nyquist rate and produces a finite set of K digital samples. In the case of an input electromagnetic signal, the information in the carrier signal may be carried in the phase differential of a number of consecutive time instants, or as differential phase shifts of a number of frequency components of the transmitted signal. The sampler measures both the inphase (I) and quadrature (Q) components of the envelope of the received signal. The samples I and Q are sent to the envelope estimator 18. The envelope estimator 18 has output corresponding to an amplitude characteristic of the signal, which is passed to arithmetic processor or computing means 20, where a differential of the logarithm of the amplitude samples is computed. This is preferably carried out in a special purpose computing means according to known principles. The square root of the sum of the squares of the inphase and quadrature components is calculated in envelope estimator or computing means 18 to produce a set of amplitude measurements A(n). The envelope A(n) may be measured directly using a conventional envelope detector or may be calculated according to $A(n)=\sqrt{(I^2(n)+Q^2(n))}$ if the information is in the time domain or $A(n)=\sqrt{(I_f^2(n)+Q_f^2(n))}$ where the $I_f$ and $Q_f$ data record is the Fourier transform (frequency transform) of the I and Q data record if the information is in the frequency domain.

Next, the preceding sample A(n−1) is subtracted from the current one, A(n), and the difference thus obtained is divided by the current sample to produce a differential of the logarithm of the amplitude samples. This may be written as (A(n)−A(n−1))/A(n)), or as Δln(A(t)) or as Δln(A(f)) depending on whether the information is in the time or the frequency domain, and produces a data record containing a finite sequence of points. Computing means 18 and 20, such as digital signal processors, to carry out such calculations are well known and include any PC compatible computer programmed to carry out the computation.

The derivative of the logarithm of m(t) with respect to t, dlnm(t)/dt, which is output 21 from processor 20 is a complex function with a real part dln|m(t)|/dt and an imaginary part d∠m(t)/dt. The real and imaginary parts can be expressed as (Eqtns 5 and 6):

$$\frac{d}{dt}\ln|m(t)| = \sum_{k=1}^{N} \frac{d}{dt} \ln|m_k(t)| \quad (5)$$

$$\frac{d}{dt} \angle m(t) = \sum_{k=1}^{N} \frac{d}{dt} \angle m_k(t) - M_1\omega \qquad (6)$$

where (Eqtn 7)

$$m_k(t) = 1 - \alpha_k e^{j\omega(t-\zeta_k)}$$

and $|m_k(t)|$ is its envelope and $\angle m_k(t)$ its phase. $m_k(t)$ is the $k^{th}$ fade of $m(t)$ which is directly related to the $k^{th}$ zero of $m(z)$. Such a relation can be used as a means to extract the z-domain zeros of $m(z)$ as illustrated in the following example explained in relation to a an input CW (continuous wave) signal transmitted over a mobile radio channel. Such an input signal is bandlimited to the frequency band $[-f_d, f_d]$ where $f_d$ is the maximum Doppler frequency ($f_d = V/\lambda$, V being the velocity of the mobile and $\lambda$ being the wavelength of the travelling wave). Also, by observing the CW signal over a finite interval $[0,T]$ where $T=n/f_d$ and n is a positive integer, the CW signal may be taken to be periodic with a period T and may be represented using its z-domain zeros with $M_1 = M_2 = n$ in Eqtn 1.

The location of the $k^{th}$ fade may be determined by examining $d\ln|m(t)|/dt$ versus t (the output 21 from processor 20) from 0 to T, and dividing the time interval $[0,T]$ into a number of subintervals $[t_{k,1}, t_{k,2}]$ each satisfying all of the following conditions:

$C_1$: $d\ln|m(t_{k,1})|/dt$ corresponds to the $k^{th}$ local minimum of $d\ln|m(t)|/dt$.

$C_2$: $d\ln|m(t_{k,2})|/dt$ corresponds to the $k^{th}$ local maximum of $d\ln|m(t)|/dt$.

$C_3$: the product of $d\ln|m(t_{k,1})|/dt$ and $d\ln|m(t_{k,2})|/dt$ is negative. (Step 22 in FIG. 1C).

$t_{k,1}$ is the lower bound of the neighbourhood, while $t_{k,2}$ is the upper bound of the neighbourhood. For the purposes of determining the location of the $k^{th}$ fade, it is only necessary to know the location of one of the upper bound and the lower bound, which may be designated $l_k$, although in the preferred embodiment described here, both the upper and lower bounds are taken (which may also be defined by $l_k = t_{k,1}, t_{k,2}$). The interval $[t_{k,1}, t_{k,2}]$ is the neighbourhood of the $k^{th}$ observable fade. Not all fades are observable. That is, not every fade has an interval associated with it which satisfies the three conditions: $C_1$, $C_2$ and $C_3$. The zero corresponding to a non-observable fade is a hidden zero. For instance, comparison of the Figures in FIG. 3 shows that two zeros are hidden or equivalently, two fades are non-observable.

Assuming that in the neighbourhood of an observable fade $m(z)$ can be well modeled as a single zero, $d\ln|m(t)|/dt$ in Eqtn 5 may be approximated as (Eqtn 8):

$$\frac{d}{dt}\ln|m(t)| \approx \frac{\alpha_k \omega \sin\omega(t-\zeta_k)}{(1+\alpha_k^2) - 2\alpha_k\cos\omega(t-\zeta_k)} \quad t_{k,1} \le t \le t_{k,2}, \qquad (8)$$

or equivalently (Eqtn 9)

$$\approx 1/t_{k,o} \frac{(t-\zeta_k)/t_{k,o}}{1 + ((t-\zeta_k)/t_{k,o})^2} \quad t_{k,1} \le t \le t_{k,2} \qquad (9)$$

where $t_{k,o} = (|1-\alpha_k|)/V(\alpha_k)\omega$. By differentiating Eqtn 8 with respect to t and equating the result to zero, one can show that: $t_{k,1} = \zeta_k - t_{k,0}$; $t_{k,2} = \zeta_k + t_{k,0}$; $d\ln|m(t_{k,1})|/dt \approx -(2t_{k,0})^{-1}$ and $d\ln|m(t_{k,2})|/dt \approx (2t_{k,0})^{-1}$.

The $k^{th}$ non-hidden zero can be extracted from its corresponding observable fade by finding $t_{k,1}$, $t_{k,2}$ and $t_{k,min}$ where the time $t_{k,min}$ satisfies the equality: $d\ln|m(t_{k,min})|/dt=0$ (see step 24 in FIG. 1C). In this case, $t_{k,o}$ can be estimated as $\hat{t}_{k,o} = (t_{k,1} - t_{k,2})/2$ (step 26), the phase $\zeta_k$ of the zero can be estimated as $\hat{\zeta}_k = t_{k,min}$ (step 28) while its depth or amplitude $\alpha_k$ can be estimated as (Eqtn 10)

$$\hat{\alpha}_k = 1 + 1/2 \ (\omega \hat{t}_{k,o})^2 \pm (\omega \hat{t}_{k,o})\sqrt{1 + 1/4 \ (\omega \hat{t}_{k,o})^2}$$

where the negative sign in Eqtn 10 corresponds to $\alpha_k > 1$, that is $m_k(t)$ is Maximum Phase (MaxP), the positive sign to $\alpha_k < 1$, that is $m_k(t)$ is Minimum Phase (MP) and $\hat{\chi}$ is the estimate of $\chi$, where $\chi$ is any parameter, throughout this patent document (see steps 32-38 in FIG. 1C).

In order to decide whether $m_k(t)$ is MP or MaxP, one has to examine the sign of the phase derivative $d\angle m(t)/dt$ in the neighbourhood of the fade since (Eqtn 11)

$$\frac{d}{dt} \angle m_k(t) = \frac{-\alpha_k\omega(\cos\omega(t-\zeta_k) - \alpha_k)}{(1+\alpha_k^2) - 2\alpha_k\cos\omega(t-\zeta_k)}$$

From Eqtn 11, $d\angle m_k(t)/dt = \pm \alpha_k \omega/|1-\alpha_k|$ (evaluated at $t=\zeta_k$), where the negative sign corresponds to a MP fade while the positive sign corresponds to a MaxP fade.

To summarize, Procedure I outlined in FIG. 1C is carried out in signal processor 12 in order to extract the $k^{th}$ non-hidden z-domain zeros of $m(z)$. Processor 12 may be a digital signal processor, or special or general purpose computer programmed according to the programs identified as APPROX and EXTRACT_ZEROS in the microfiche appendix. The performance of Procedure I results in the transformation of $m(t)$ into another, compressed, signal consisting of depth and location values for each fade. Procedure I consists of:

$P_1$: The neighbourhood $[t_{k,1}, t_{k,2}]$ of the $k^{th}$ observable fade (i.e. $[t_{k,1}, t_{k,2}]$ that satisfies $C_1$, $C_2$ and $C_3$) and $t_{k,min}$ are obtained.

$P_2$: $t_{k,o}$ is estimated as $(t_{k,2}-t_{k,1})/2$ and $\zeta_k$ is estimated as $t_{k,min}$.

$P_3$: It is decided whether the $k^{th}$ observable fade is MP or MaxP from Eqtn 11 and $\alpha_k$ is obtained accordingly from Eqtn 10.

Figure 2A:
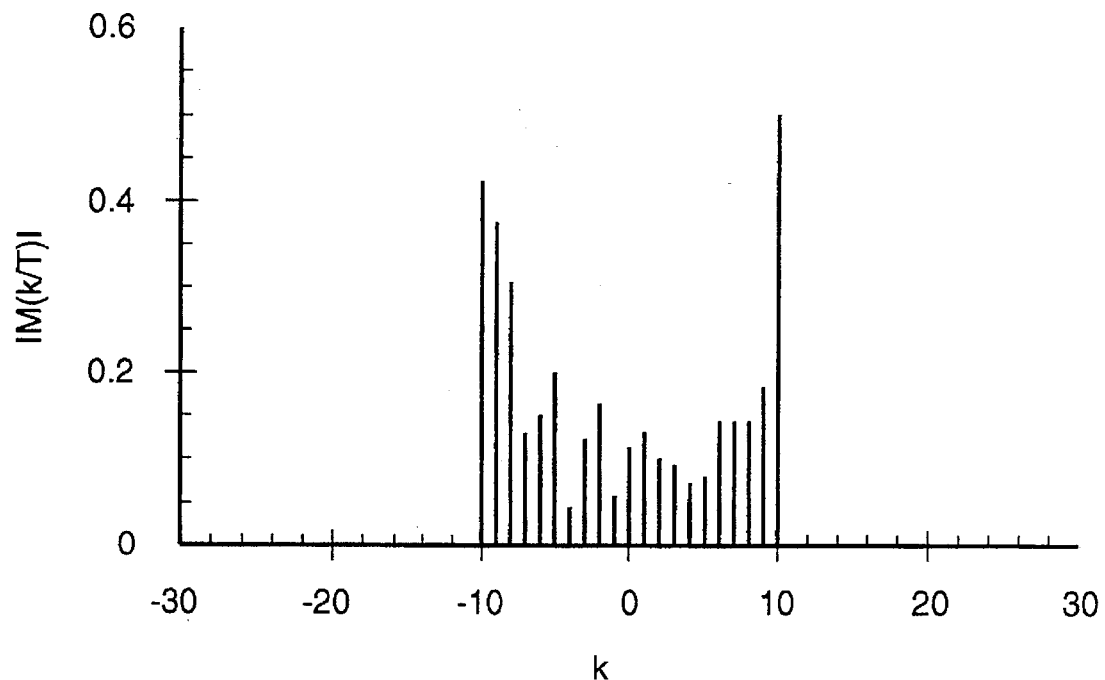
FIG. 2A is a graph showing the amplitude of the discrete function of an exemplary function m(t)
Figure 2B:
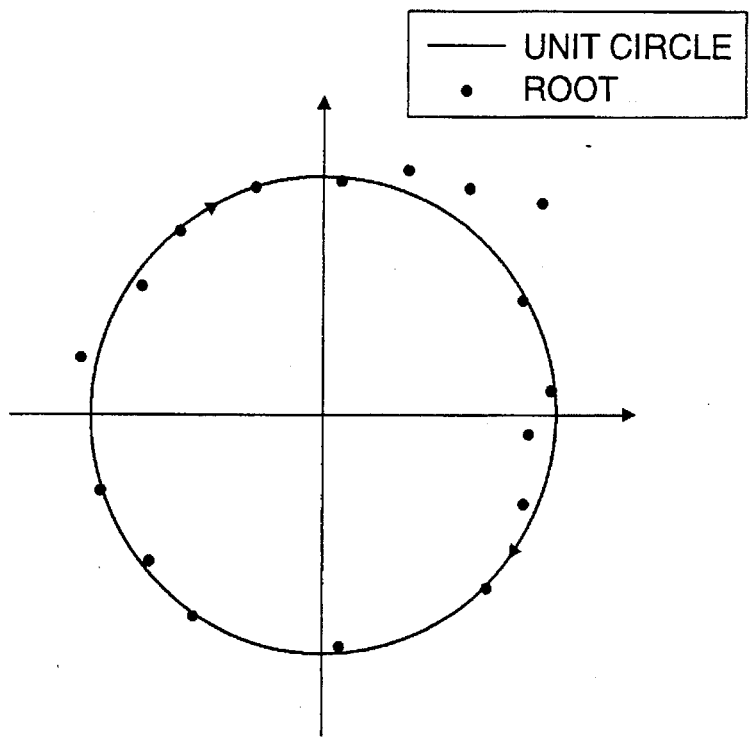
FIG. 2B is a graph showing the roots of m(z)
Figure 3A:
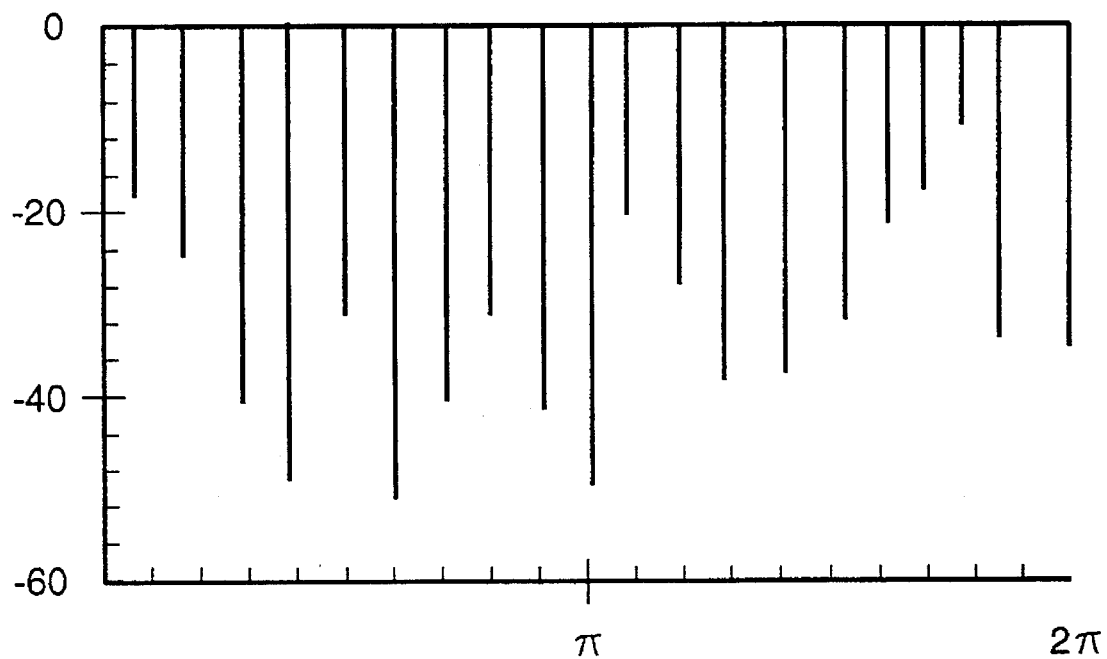
FIGS. 3(a), 3(b), 3(c) and 3(d) show respectively the closeness of the zeros of the function $|1-\alpha_k|$ to the unit circle, the envelope of the function m(t), the derivative of the log of the envelope of m(t) and the phase derivative of the function m(t)
Figure 3B:
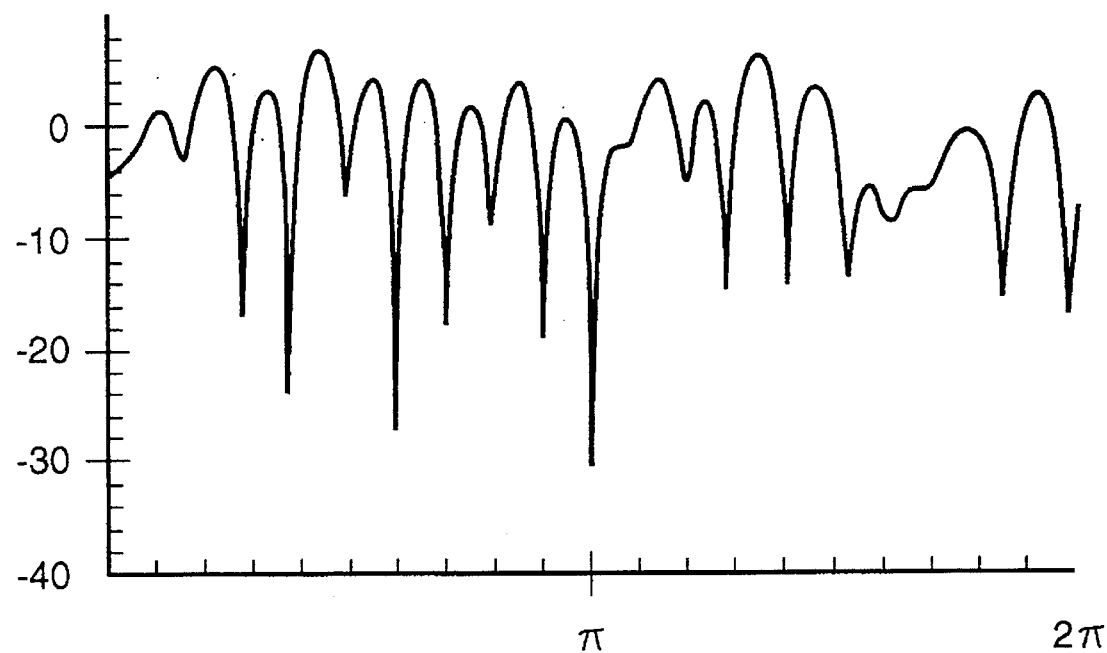
Figure 3C:
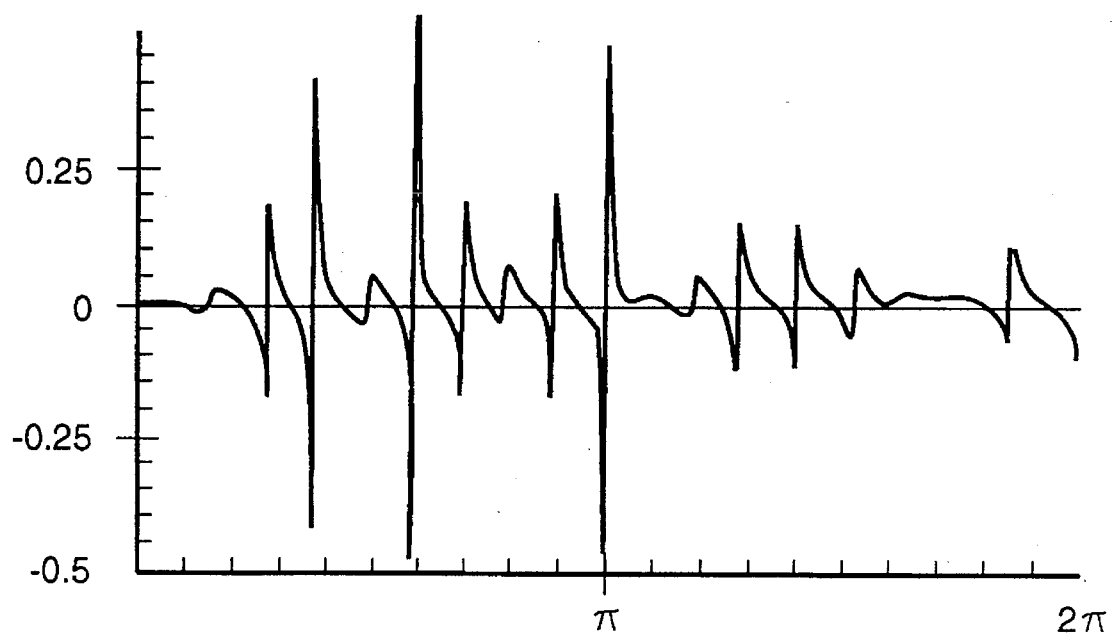
Figure 3D:
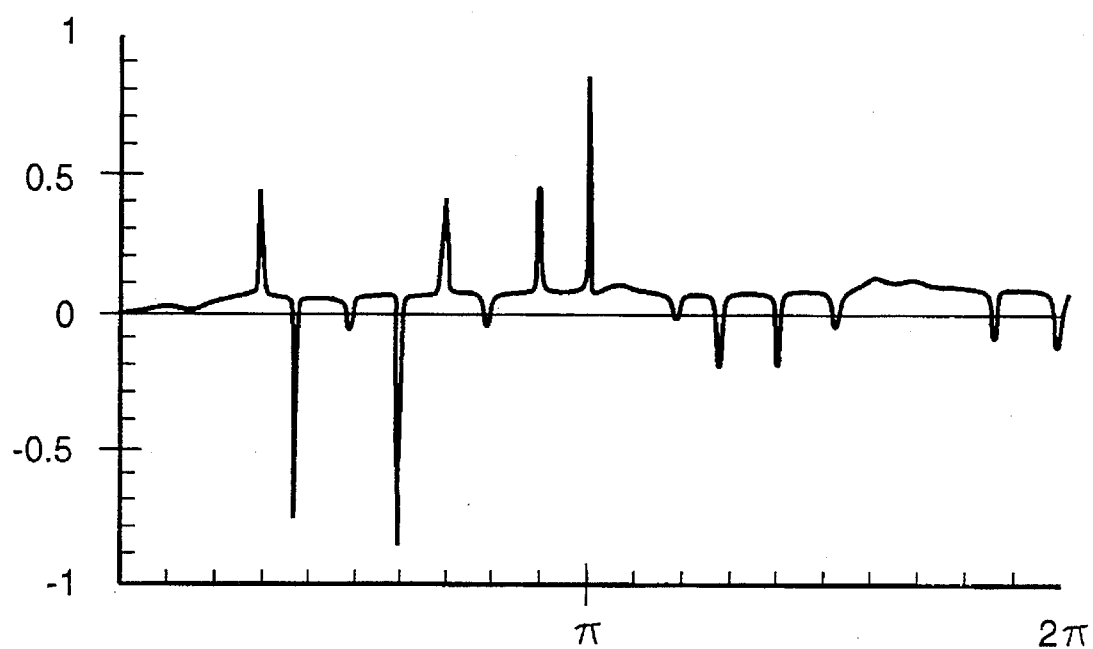

FIG. 2a displays the discrete spectrum $M(k/T)$ of an exemplary CW signal $m(t)$ for $n=10$ and $\lambda=0.28669$ m, i.e. for an observed distance $VT=2.8669$ m where the signal is received by a mobile moving at speed $V=100$ km/hr and an observation period 100 ms. FIG. 2b shows the z-domain zeros of $m(z)$ obtained by factorizing the polynomial $\Sigma M(k/T)z^{-k}$ for $k=-n$ to n. FIG. 3a shows the function: $|1-\alpha_k|$ in dB versus the phase $-(\omega\zeta_k)$ of the $k^{th}$ zero $z_k$ as one travels from 0 to $2\pi$ around the unit circle, in a clockwise rotation. FIGS. 3b, c and d shows the envelope $|m(t)|$, the function $d\ln|m(t)|/dt$ and the phase derivative $d\angle m(t)/dt$ respectively, versus $\omega t$ from 0 to $2\pi$. Since the function $|1-\alpha_k|$ indicates the closeness of the $k^{th}$ zero $z_k$ of $m(z)$ to the unit circle, FIG. 3a shows that the $k^{th}$ fade, $m_k(t)$, of $m(t)$ corresponds to the $k^{th}$ zero, $z_k$, and that the closer the zero to the unit circle the larger the magnitude of the fade at $t=\zeta_k$.

Figure 4:
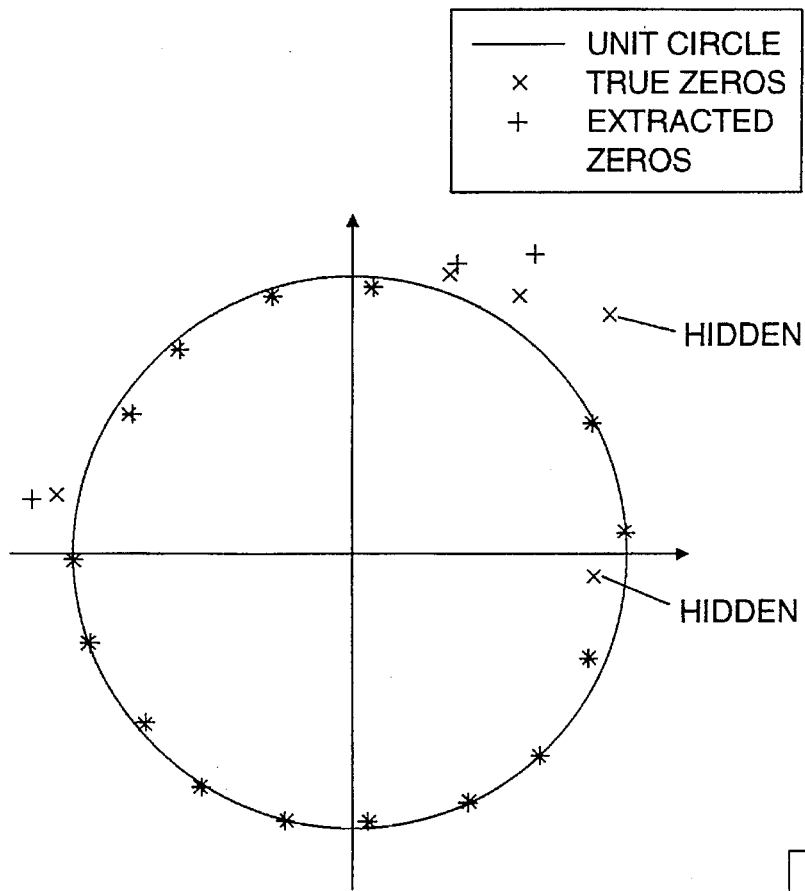
FIG. 4 shows a comparison of the true zeros of an exemplary function to the extracted zeros.

FIG. 4 displays the z-domain zeros extracted using Procedure I compared with the true z-domain zeros in FIG. 2B. Once the z-domain zeros have been obtained, the locations and depths may be stored as pairs of data points or the equivalent (such as differentials), or may be processed immediately, for example as described elsewhere in this patent document.

Alternatively, the depth and location of each fade may be determined by taking a Fourier transform of the signal to produce data points corresponding to the Fourier coefficients of the signal, forming a polynomial using the Fourier coefficients of the signal, factorizing the polynomial to produce the roots of the polynomial; and deriving the location and the depth of each fade from the roots of the polynomial. Such processing may be accomplished by programming a computer with the programs identified as EXACT and FACTORIZE in the micofiche appendix. However, this procedure is believed to be less efficient and is not preferred.

The Extraction of the Hidden Zeros

Figure 1D:
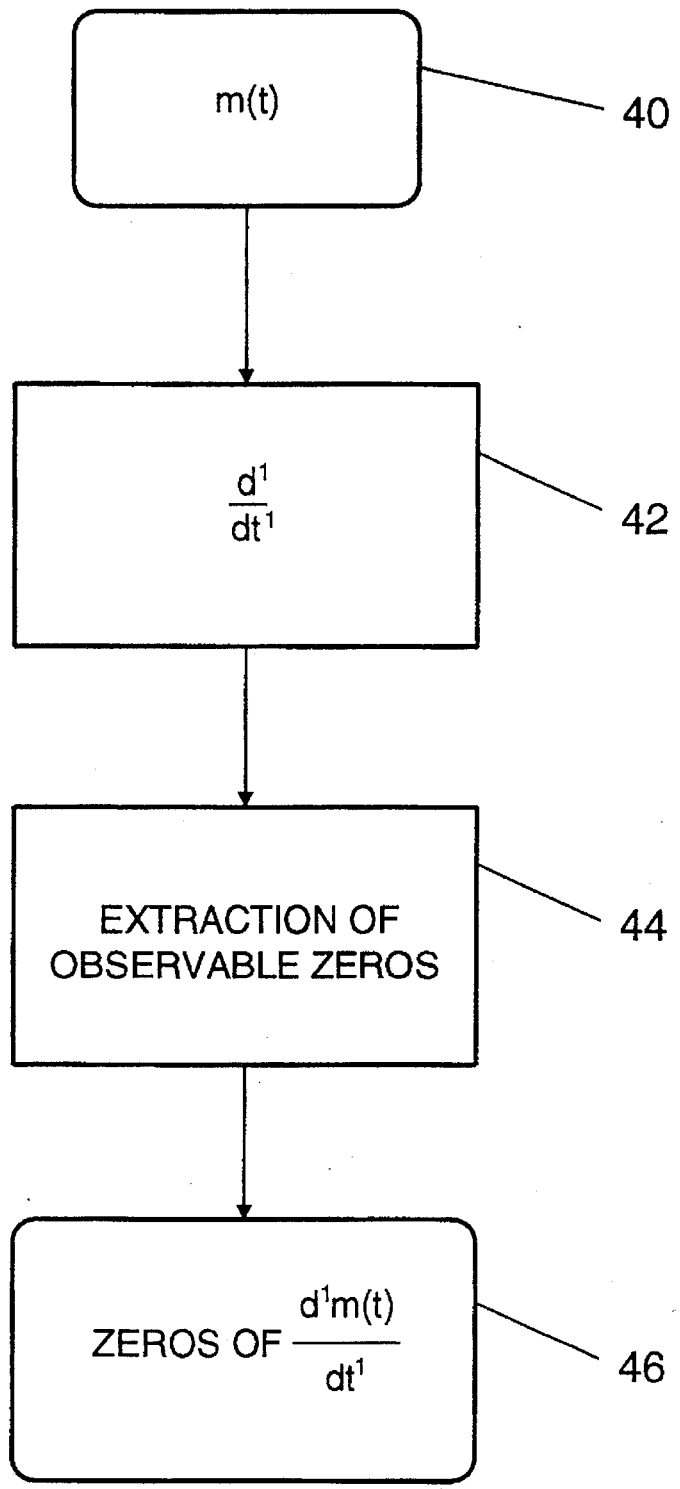
FIG. 1D is a schematic showing further signal processing to extract hidden zeros of an input signal according to one aspect of the invention.

FIG. 4 shows that two zeros of m(z) have not been extracted from the fades of m(t). The missing zeros are hidden. In this case, they can be extracted through successive differentiation of m(t) as long as $M_1=M_2$ in Eqtn 1. As shown in FIG. 1D, the signal m(t) is first acquired (step 40), then differentiated (step 42) using known means one or more times, then the zeros are extracted using Procedure 1 (step 44) to yield the zeros of the differentiated signal (step 46), which may then be stored or transmitted and the signal reconstructed or further processed as required. The differentiation process may be carried out in a computing means programmed according to the program identified as DIFFERENTIATE_ZEROS in the microfiche appendix.

Figure 5:
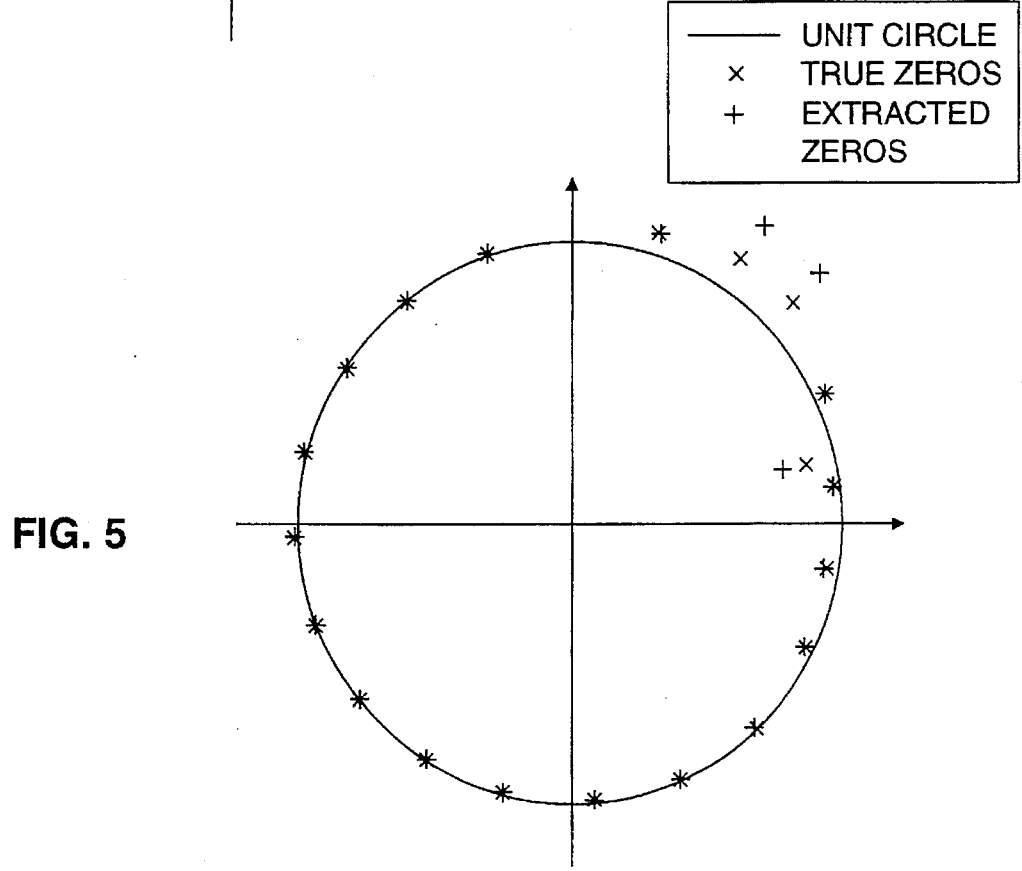
FIG. 5 shows a comparison of the true zeros of an exemplary function after differentiation to the extracted zeros.

The reasoning behind successive differentiation of m(t) is that the $k^{th}$ observable fade of $(d^L/dt^L)$ m(t) corresponds to the $k^{th}$ non-hidden zero of $d^L/dz^L$ m(z) and that after an adequate number of differentiations all the fades of $d^L/dt^L$ m(t) become observable. In some applications however, a hidden zero can be ignored as in differential phase estimation and speech compression. In this case, the above zero extraction procedure is sufficient, with no need for successive differentiation. On the other hand, in spectral estimation, only the effect of the hidden zero on the discrete spectrum M(k/T) is important. In other words, by differentiating m(t) a number L of times and then extracting the zeros of $d^L/dz^L$m(z), $(-jk\omega)^L$M(k/T) is estimated. This is demonstrated in FIG. 5 which displays the z-domain zeros of $d^2/dz^2$m(z) compared with the extracted zeros corresponding to the fades of $d^2/dt^2$m(t). From FIG. 5 one can see that all the zeros of $d^2/dz^2$m(z) have been extracted. It should be cautioned that successive differentiation of m(t) requires filters with sharp cut-offs, and it is preferred to keep the number of differentiations small. While the number of differentiations required will vary with the intended application, typically the number of acceptable differentiations will be in the order of 3 or 4.

In some applications such as in the estimation of the phase differential of m(t) from its envelope, only steps $P_1$ and $P_2$ in Procedure I are necessary. Also, based on Eqtn 11, Procedure I can be replaced by an equivalent procedure that depends on the phase derivative of m(t). There is however no significant advantage for using Eqtn 11 instead of Eqtn 6 to extract the observable zeros of m(z). In either case, the z-domain zeros of m(z) do not depend on any scaling or frequency shifting of m(t).

Applications: Spectral Estimation

When using the z-domain zeros of a BL function, m(t), to estimate its discrete spectrum, M(k/T), m(t) may be classified as either periodic or aperiodic. An aperiodic BL function can be classified as either having a continuous spectrum or a discrete spectrum. An example of an aperiodic BL function m(t) with a discrete spectrum is when m(t) consists of a finite sum of non-commensurate sinusoids.

An aperiodic BL function m(t) with a continuous spectrum can be assumed to be periodic with a period T when T is the interval of observation. In this case, its continuous spectrum M(f) is forced to be sampled at integer numbers of 1/T. This was done successfully above in the description of the extraction of the z-domain zeros. However, to assume that an aperiodic BL function m(t) with a discrete spectrum is periodic would cause substantial distortion to M(f), particularly when M(f) contains spectral lines with a frequency separation less than 1/T.

Spectral Estimation of a Periodic BL Function

When m(t) is a BL periodic function, its sampled spectrum M(k/T) can be derived from the z-domain zeros $z_k$ for $k=-M_1$ to $M_2$ of m(z) since from Eqtn 2 and Eqtn 3 we have (Eqtn 12)

$$\prod_{k=1}^{N} (1-z^{-1}z_k) = \frac{z^{-M_1}}{C_{-M_1}} \sum_{k=-M_1}^{M_2} c_k z^{-k}$$

and $c_k=M(k/T)$ for $k=-M_1, \ldots, M_2$. As illustrated in FIG. 6, the z-domain zeros of m(z) are first extracted in computing means 62 using Procedure I, then one can expand the product $\Pi(1-z^{-1}z_k)$ for k=1 to N in Eqtn 12 using computing means 64 as shown in the next succeeding equation and finally one can estimate (Eqtn 13)

$$M(k/T) \frac{e^{jM_1\omega t}}{c_{-M_1}}$$

as the coefficient associated with $z^{-k}$ in the expansion of $\Pi(1-z^{-1}z_k)$ for k=1 to N in computing means 66. The expansion can be carried out in a serial manner or in a parallel manner. The serial manner is useful for a real time spectral estimation of m(t), i.e. when m(t) is acquired constantly. In this case, one can expand $\Pi(1-z^{-1}z_k)$ for k=1 to N in Eqtn 12 in a recursive manner as follows (Eqtn 14)

$$p_k(l)=p_{k-1}(l)-p_{k-1}(l-1)z_k$$

where $k=2, \ldots, N$, $l=1, \ldots, k+1$ and $p_k(l)$ denotes the coefficient of $z^{-1}$ for k terms in the product series. One should note that $p_k(1)=1$ and $p_k(0)=0$ for all k, $p_1(2)=z_1$ and $p_k(l)=0$ for $l \geq k+2$.

The complexity of the z-domain transform is lower than the complexity of a Fast Fourier Transform (FFT). If the sampling of m(t) is carried out at the Nyquist rate and the number of samples k is a power of 2, then at the $k^{th}$ stage, the number of complex multiplications and additions required for the partial FFT is $2+4+\ldots+k/2+k$, while it is only k for the z-domain zeros. The complexity of the zero extraction is not included in this calculation. It corresponds however to the extraction of one zero at a time.

Digital Spectral Estimation

The locations $\zeta_k$ and depths $\alpha_k$ of the fades of the input signal may be used to estimate the spectrum M(k/T) of the input signal. It can be shown that the spectrum may be estimated as (Eqtn 15)

$$\hat{M}((N/2+1)/T) = \sum_{i=1}^{G'} \prod_{k=1}^{\log_2 N} \hat{\alpha}_{i(k)} e^{j\omega \hat{\zeta}_{i(k)}}$$

where (Eqtn 16)

$$\hat{\alpha}_{i(k)} e^{j\omega \hat{\zeta}_{i(k)}}$$

is the estimate of (Eqtn 16a)

Figure 14:
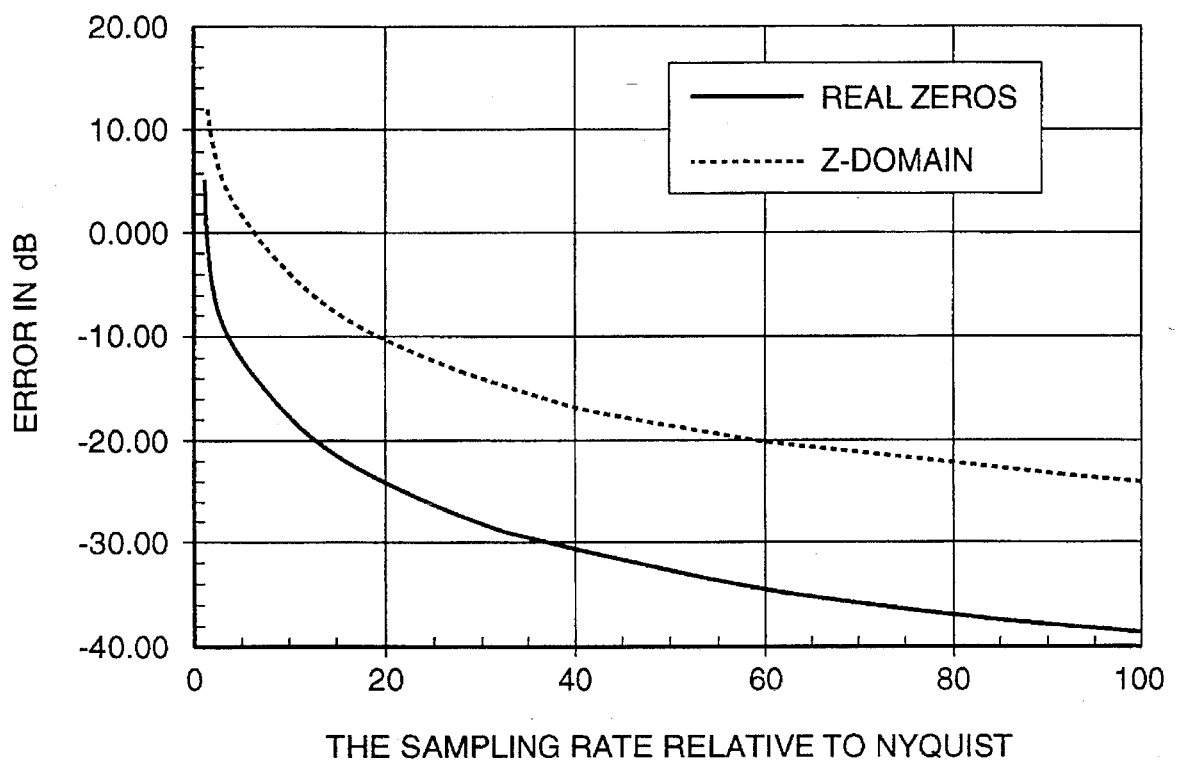
FIG. 14 is a graph showing a comparison between spectral estimation using the z-domain zeros and spectral estimation using real zeros.

$\alpha_{i(k)} e^{j\omega \zeta_{i(k)}}$ and G' is the number of possible ways to combine $\log_2 N$ different elements out of a set of N elements, i.e. $G'=N!/(N-\log_2 N)!$. FIG. 14 compares the squared error $|M((N/2+1)/T)-\hat{M}((N/2+1)/T)|^2$ obtained using Eqtn 15, assuming that $K'=N=2$, i.e. assuming that $K=M_1$, with the equivalent error obtained using real zeros. It is assumed in FIG. 14 that $\alpha_k \approx 1$ for all k.

Phase Differential Estimation

Referring to FIG. 7, the z-domain zeros may be used to estimate the phase differential $\delta\phi_l$ of a BL periodic function m(t) from its sampled envelope $|m_1|$, where $\delta\phi_l = \angle m_l - \angle m_{l-1}$, $m_l = m(lT_0)$ and $T_0$ is the sampling interval. The phase differential $\delta\phi_l$ of an input signal may be estimated using the following estimate (Eqtn 17)

$$\hat{\delta\phi_1} = 1/t_{k,o} \frac{-1}{1+((lT_0 - t_{k,min})/t_{ko})^2}$$

for $t_{k,min} - 3t_{k,o} \leq t \leq t_{k,min} + 3t_{o,k}$. The input signal is first acquired in signal acquisition means 10, and then the zeros are extracted using signal processor 12 in the manner described above (Procedure I). The compressed signal output from the zero extractor is then processed in phase differential estimator 72 according to Eqtn 17 to yield the phase differential 74.

Estimating the phase differential of a sample input signal results in a Relative Mean Squared Error of about 0.021 for the signal illustrated in FIGS. 2a, 2b, 3a, 3b, 3c and 3d, by comparison with 0.07 for a non-parametric technique using a Hilbert transform as described in M. Fattouche and H. Zaghloul, "Estimating the Phase Differential of Signals Transmitted over Fading Channels,". Electron. Lett. ,. Vol. 27, no. 18, pp. 1823–1824, June 1991.

The estimated phase differential may also be used to reduce the effects of random frequency modulation due to flat fading as illustrated in FIG. 8. Firstly, an input signal is acquired in signal acquisition means 10 and an estimate $|\hat{m}(t)|$ is made of the envelope $|m(t)|$ of the input signal. This is accomplished by first obtaining the envelope $|z_o(t)|$ of $z_0(t)$, where $z_0(t)$ is the complex envelope of a DMPSK signal u(t), multiplied by the complex envelope m(t) of the CW input signal transmitted over a flat fading channel and contaminated with Additive White Gaussian Noise $n_0(t)$. u(t) is defined as (Eqtn 17a)

$$u(t) = \sqrt{E_b/T_0} \exp\left[ j \sum_{l=-\infty}^{\infty} (2\pi/M)\gamma_l p(t-lT_0) \right]$$

where $\gamma_l = \beta_l + \gamma_{l-1}$, $\beta_l$ is the information digit transmitted once every $T_0$ and takes one of the M values in the alphabet 0, 1, . . . , M−1, p(t) is a shaping pulse, $E_b$ is the average transmitted bit energy. The envelope $|z_o(t)|$ is then bandlimited to twice the Doppler bandwidth using band pass filter 82, i.e. to the frequency band $[-2f_d, 2f_d]$. The bandlimitation reduces the power of the thermal noise which is directly related to the signal bandwidth. The reason for bandlimiting $|z_o(t)|$ to twice the Doppler bandwidth is because taking the envelope of a bandlimited signal doubles its bandwidth. Next an estimate for $\delta\phi_k$ is obtained using Eqtn 17 or according to the technique described in "Estimating the Phase Differential of Signals Transmitted over Fading Channels" cited above. Next the mean $\mu$ of $\delta\phi_k$ is estimated. This is achieved by obtaining the estimate $\hat{\mu}$ of $\mu$ where (Eqtn 18)

$$\hat{\mu} = \frac{1}{N} \sum_{l=1}^{L} (<z_{0,l} - <z_{0,l-1})$$

Next the sign of $\delta\phi_l$ is estimated. This is achieved by computing the two values (Eqtn 19) and (Eqtn 20)

$$S_+ = \sum_{l=l_1}^{l=l_2} \min_{\gamma_l \in \{0,\ldots,M-1\}} \{(<z_{0,l} - <z_{0,l-1}) - |\hat{\delta\phi_l}| - \gamma_l\}^2$$

and $$S_- = \sum_{k=l_1}^{k=l_2} \min_{\gamma_l \in \{0,\ldots,M-1\}} \{(<z_{0,k} - <z_{0,k-1}) + |\hat{\delta\phi_k}| - \gamma_k\}^2 \quad \text{(Eqtn 20)}$$

where $l_1 = (t_{k,min} - 3t_{k,o})/T_0$ and $l_2 = (t_{k,min} + 3t_{k,o})/T_0$. If $S_+ < S_{31}$ then $\hat{\delta\phi_k} + \mu$ in Eqtns 19 and 20 is assigned a positive sign, otherwise, it is assigned a negative sign. The processing of the bandlimited signal to produce an estimate of the phase differential, its mean and sign, may be accomplished using phase differential estimator 84. Finally, the signal is adjusted for the phase differential due to the flat fading channel using a decoder or demodulator 86. This is achieved by subtracting $(\hat{\delta\phi_l} + \hat{\mu})$ from $<z_{0,l} - <z_{0,l-1}$.

When a square-root Nyquist pulse is employed in the transmitter to shape the DMPSK signal (such as in IS-54), $z_{0,l}$ has to be match-filtered first before any decision is made, and unless $z_{0,l}$ is adjusted for both amplitude and phase distortion, match-filtering can cause Intersymbol Interference (ISI) to the DMPSK signal. For this reason, the amplitude distortion due to the flat fading channel is preferably adjusted by dividing $z_{0,l}$ by $|\hat{m}_l|$ and the phase differential is adjusted as explained above, before match-filtering $z_{0,l}$.

Vocoder

The extraction of the z-domain zeros from a speech signal followed by the quantization of the amplitude and angle of the extracted zeros may be used in a vocoder. The new vocoder is believed to be able to achieve speech compression of toll quality at a vocoder rate of 8.5 Kbps.

Figure 9:
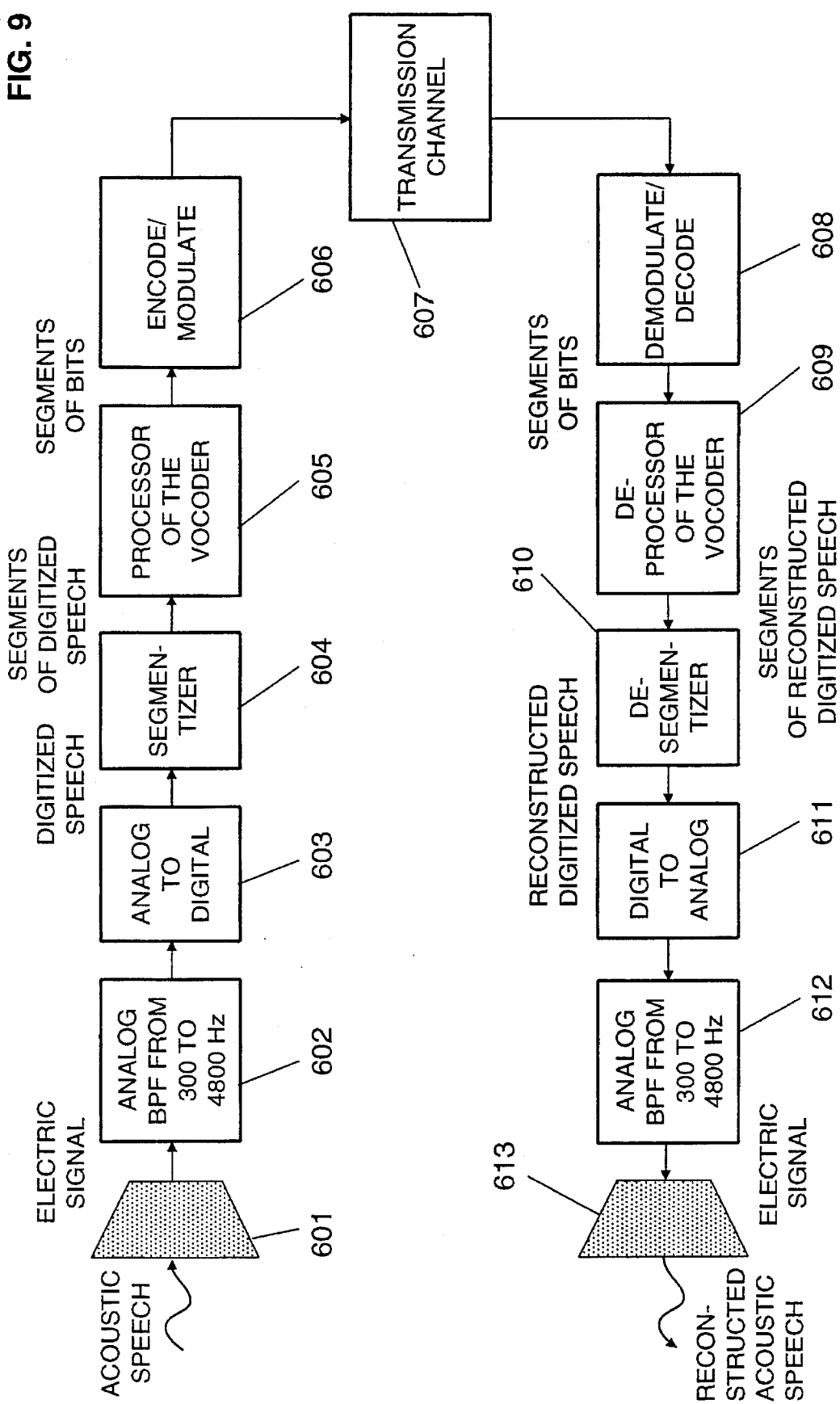
FIG. 9 is a schematic showing a vocoder according to one aspect of the invention.

The vocoder is described in FIG. 9. First, an acoustic speech signal is acquired using a signal acquisition means formed of blocks 601, 602, 603 and 604 in FIG. 9. An input acoustic speech signal is transformed into an electric signal through a transducer 601. The electric signal is bandpass filtered from 300 to 4800 Hz in bandpass filter 602, then sampled and digitized using an analog-to-digital device 603 and segmentized into timelimited segments (e.g. 10 ms segments) in segmentizer 604. The segmentizer may be a digital computer programmed in accordance with the program identified as SPEECH_CUT_PASTE in the microfiche appendix. The processor 605 of the vocoder takes a segment of digitized speech and generates a corresponding segment of bits. The processor may be a digital computer programmed in accordance with one of the programs identified as SPEECH_VOCODER or SPEECH_FACTORIZE in the microfiche appendix. The bits are encoded and modulated in encoder/modulator 606 and transmitted over transmission channel 607. At a receiver 608, the signal is demodulated and decoded into bits. The combination of encoder/modulator 606, channel 607 and demodulator/decoder 608 can consist of any communication system such as a radio modem, an optical fiber modem, a telephone line, a satellite modem, a cellular phone, etc . . . or any access device system such as a PBX, a local loop, a wireless local loop, etc. . . . or a storage and/or a computing device, such as CD ROM, hard disk, magnetic storage, or any suitable combination thereof. Each segment of bits decoded in the decoder 608 is transformed into a corresponding segment of reconstructed digitized speech using deprocessor 609 of the vocoder. The segments are then combined to form a continuous stream of digitized speech in desegmentizer 610. The continuous digitized speech is transformed into an analog electric signal through a digital-to-analog device 611, bandpass filtered from 300 to 4800 Hz in bandpass filter 612 and turned into an acoustic signal through a transducer 613.

Figure 10:
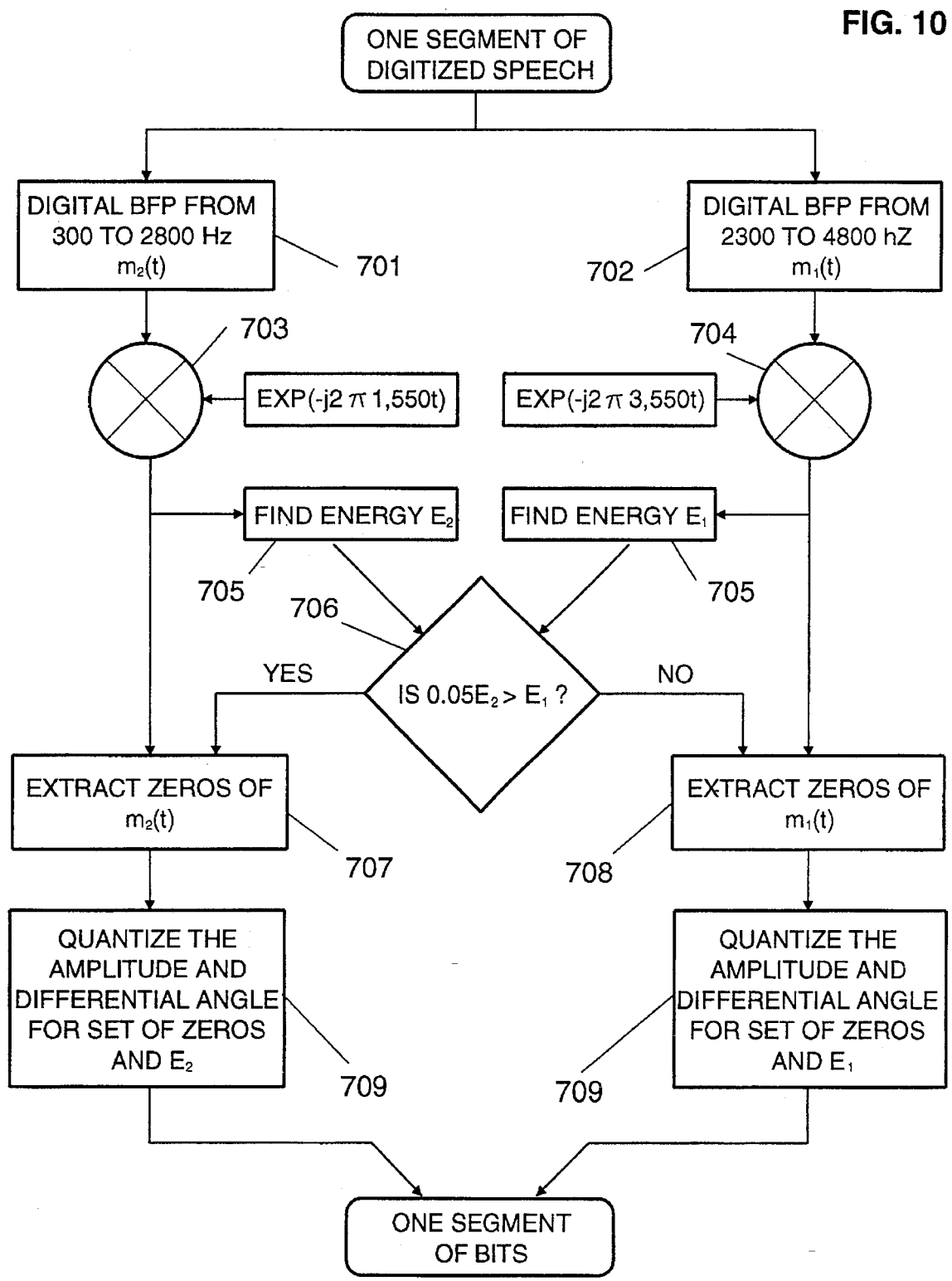
FIG. 10 is a schematic showing the function of a processor for use in the vocoder of FIG. 9.

The processor 605 of the vocoder is described in FIG. 10. First, each segment of digitized speech m(t) is forced to be analytic. This is achieved by limiting m(t) to its Upper Side Band (USB), i.e. to the frequency band from 300 to 2,800 Hz generating $m_2(t)$, and to the frequency band from 2,300 Hz to 4,800 Hz generating $m_1(t)$ using bandpass filters 701 and 702 respectively. Then, $m_2(t)$ is forced to be lowpass by multiplying it by $e^{-j2\pi 1550 t}$ generating $\tilde{m}_2(t)$ using multiplier 703 and $m_1(t)$ is forced to be lowpass by multiplying it by $e^{-j2\pi 1550 t}$ generating $\tilde{m}_1(t)$ using multiplier 704. The bandpass filters 701 and 702 together with the multipliers 703 and 704 constitute a low pass equivalent generator. The energy $E_2$ in $\tilde{m}_2(t)$ and the energy $E_1$ in $\tilde{m}_1(t)$ are obtained in arithmetic processor or computing means 705 and compared in comparator 706. If $0.05\ E_2$ is smaller than $E_1$, it is assumed that the segment of digitized speech is voiced otherwise it is referred to as others. When the segment is found to be voiced, the z-domain zeros of $\tilde{m}_2(t)$ are extracted using signal processor 707, otherwise the z-domain zeros of $\tilde{m}_1(t)$ are extracted using signal processor 708. The amplitude and angle differential for each zero are then quantized in quantizer 709 using separate codebooks for voiced segments than for others. Also, the choice of voiced versus others is reflected in one bit in the quantizer 709. Finally, the energy $E_i$ is quantized in quantizer 709 where i takes either the value 1 or the value 2. Thus, the final outcome of the processor is a segment of quantization bits representing the segment m(t) of digitized speech.

The extraction of the z-domain zeros is carried out as follows. The envelope of the lowpass signal, $\tilde{m}_i(t)$, is first differentiated then lowpass filtered in order to expose the hidden zeros, where i takes either the value 1 or the value 2. Finally, the z-domain zeros $$\{\alpha_k e^{j\zeta_k}\}_{k=1}^{N} \text{ of } \tilde{m}_i(t)$$

are extracted using Procedure I described above, where N is the number of zeros in one segment obtained as the product of the time limited observation interval times the bandwidth of $\tilde{m}_i(t)$, for example when the observation interval is 10 ms, N is equal to 25 zeros per segment since the bandwidth of $\tilde{m}_i(t)$ is 2,500 Hz.

Figure 11A:
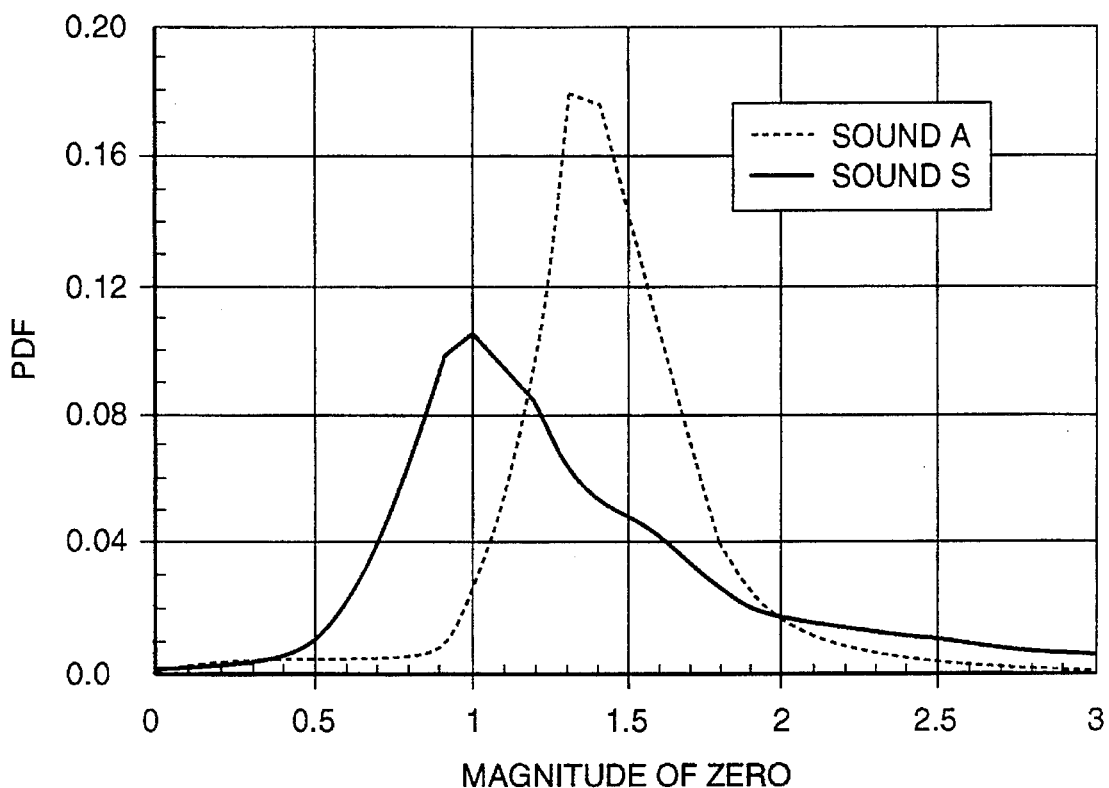
FIG. 11a shows a probability density function of the magnitude of the zeros for a voiced ("a") and unvoiced ("s") sound.
Figure 11B:
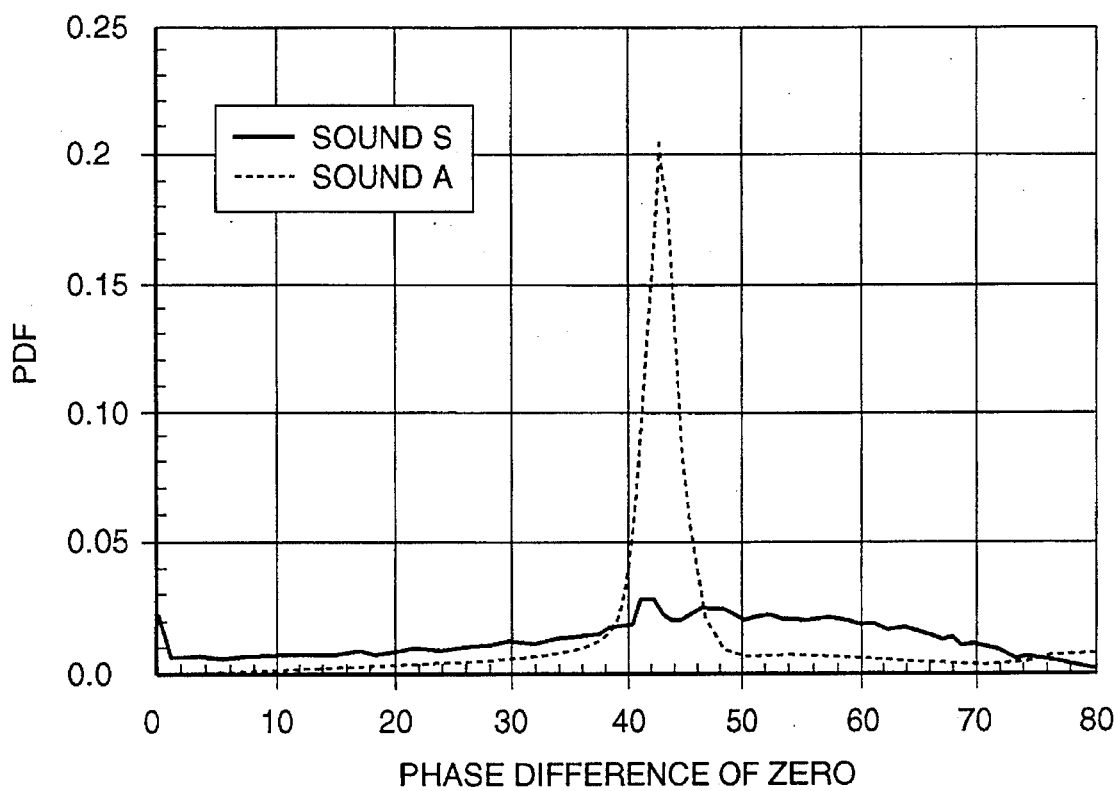
FIG. 11b shows a probability density function of the phase difference between adjacent zeros for a voiced and unvoiced sound.

FIGS. 11*a*&*b* display the Probability Density Function (PDF) of the magnitudes $\{\alpha_k\}$ for k=1 to N and of the differential angle $\{\zeta^k-\zeta^{k-1}\}$ for k=1 to N of the zeros for the sound "a" (voiced) and the sound "s" (unvoiced). FIGS. 11*a*&*b* show that the angle differential corresponding to the unvoiced segments has a much larger variance than the angle differential corresponding to the voiced segments. Also, the variance of the voiced segments is smaller than any other types of segments such as background noise (which is generally white), fricatives, etc . . . For this reason, others is classified with a phase difference larger than $2\pi/N$ 20% while voiced is classified with a phase difference smaller than $2\pi/N$ 20%, where N is the number of zeros in one segment.

The quantization of the z-domain zeros consists of quantizing the magnitude $\alpha_k$ and the angle differential $\zeta_k-\zeta_{k-1}$ separately from one another since the two quantities are essentially independent. Also, the phase difference is important for speech intelligibility whereas the magnitude plays a minor role. For this reason, only 1 bit of quantization is assigned for $\alpha_k$ whether the speech segment is classified as voiced or others. On the other hand, 2 bits of quantization are assigned for $\zeta_k-\zeta_{k-1}$ when the speech segment is classified as voiced and 4 bits of quantization when it is classified as others. By making the assumption that a speech segment is voiced 80% of the time, the code rate is ((1+2)0.8+(1+4)0.2)*2,500 which is equal to 8.5 Kbps. In order to reduce the code rate further, one can employ subband coding such as used in other coding techniques such as in Linear Predictive Coding (LPC) and in Adaptive Differential Pulse Code Modulation (ADPCM). In this case, only segments that are classified as voiced are divided into four fixed non-overlapping subbands with a band reduction of 30%, i.e. the code rate becomes ((1+2)*0.8*0.7+(1+4)*0.2)*2,500 which is equal to 6.7 Kbps. An added reduction is achieved by allowing the subbands to be selected adaptively. Also, a rejection of the hidden zeros can represent a 10% reduction in the code rate, i.e. achieving approximately a 6 Kbps code rate.

Figure 12:
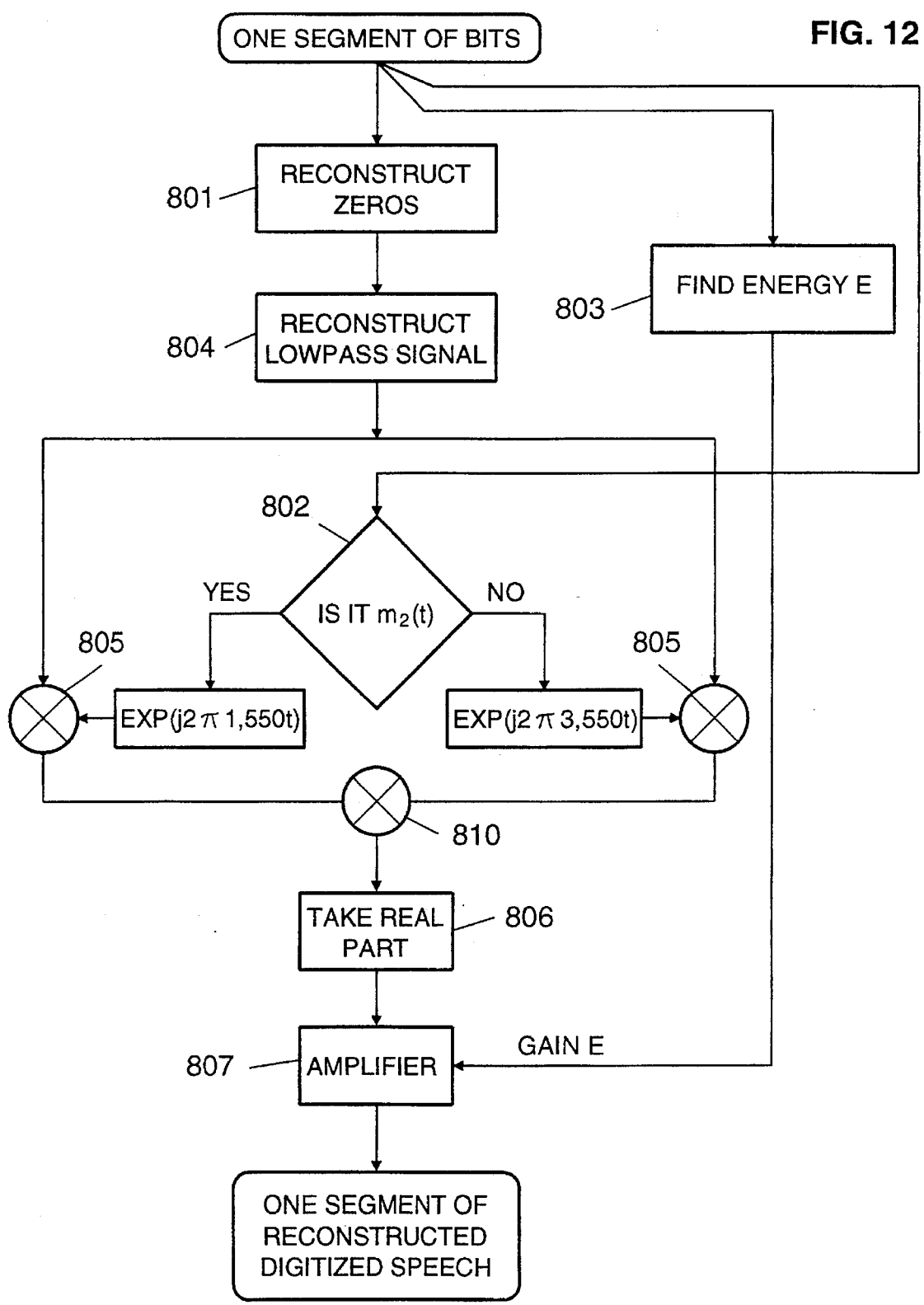
FIG. 12 shows a deprocessor for use with the vocoder of FIG. 9.

FIG. 12 describes the deprocessor 609 of the vocoder. From the received segment of bits the magnitudes $\{\alpha_k\}$ for k=1 to N and the differential angle $\{\zeta^k-\zeta^{k-1}\}$ for k=1 to N, the z-domain zeros $\{\alpha_k e^{j\zeta_k}\}$ for k=1 to N of $\tilde{m}_1(t)$ are reconstructed in signal processor 801. From the received segment of bits, the indicator i is removed for input to decision circuit 802 and $E_i$ is calculated in processor 803. From the zeros, the lowpass signal $\tilde{m}_1(t)$ is reconstructed in signal processor 804 and the analytic signals $m_i(t)$ are reconstructed in multiplier 805 according to whether the signal is $m_1(t)$ when (i=1) or $m_2(t)$ when (i=2) and then added in adder 810. The real part of the analytic signal may then be taken in processor 806 and amplified according to its original energy $E_i$ in amplifier 807 to produce an estimate of the original digitized signal m(t).

It is believed that the proposed speech coder can achieve rates that are competitive with established vocoders such as VCELP (13 Kbps code rate), while being less complex, requiring less delay and being less sensitive to channel distortions, all important requirements for Personal Communication Network (PCN).

Virtual Angle Diversity

Figure 13:
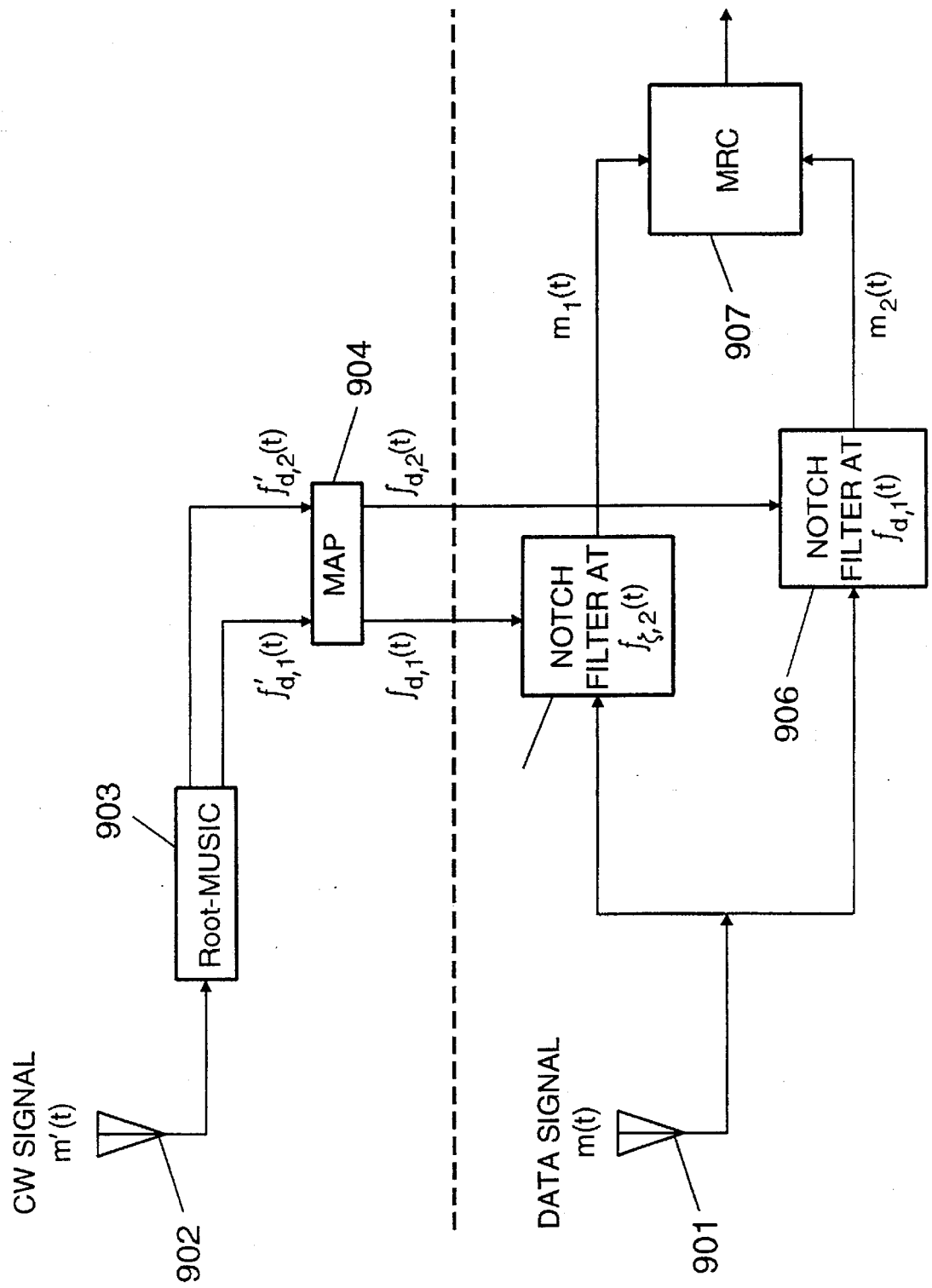
FIG. 13 is a schematic of the processing of a signal according to one aspect of the invention to resolve the signal into two different frequencies and to combine them.

Referring to FIG. 13, m(t) is a function representing a received signal at the antenna 901 of a mobile radio transceiver (MS). It is assumed that m(t) may be characterized as follows (Eqtn 21):

$$m(t)=m_1(t)+m_2(t)$$

where $m_k=A_k(t)S_k(t)e^{j(2\pi f_{d,k}(t)+\theta_k(t))}$ is the $k^{th}$ cluster for k=1,2. $A_k, f_{d,k}(t)$ and $\theta_k(t)$ are the amplitude, Doppler frequency and phase of the $k^{th}$ cluster at time t, and $S_k(t)$ is a modulated signal associated with the $k^{th}$ cluster. The (data signal) Doppler frequency $f_{d,k}(t)$ is defined as (Eqtn 22)

$$\frac{V\cos\phi_k(t)}{\lambda}$$

where V is the velocity of the MS, $\phi_k$ is the Angle-of Arrival (AOA) of the $k^{th}$ cluster relative to the motion of the MS and $\lambda$ is the wavelength of the travelling waves. For a specific implementation of the invention in an IS-54 environment, it may be taken that:

A1. $\lambda=35$ cm and $V \geq 25$ Km/Hr. In general, the minimum velocity for which this aspect of the invention will work is inversely proportional to the sampling rate and proportional to the wavelength of the incoming waves.

A2. $f_{d,k}(t)$ is constant over a $\lambda/2$ distance for k=1,2, which typically applies since the angles of arrivals of incoming waves are essentially constant within distances that are much smaller than the cell radius when the MS travels on a straight line.

A3. There exists a value to such that $A_k(t+t_o+nT)$, $\theta_k(t+t_o+nT)$ and $S_k(t+t_o+nT)$ are constant for $0 < t < T/2$ and for k=1,2 where T is one symbol duration of the modulated signal (for IS-54 T=41.2 µs), which applies if rectangular pulse shaping is used and if timing recovery is perfect and since the channel's impulse response does not change in 20.6 µs even when travelling at 100 Km/Hr which corresponds to a motion of 0.6 mm.

A4. There is a CW signal m'(t) such that (Eqtn 23)

$$m'(t) = \sum_{k=1}^{2} A'_k(t) e^{j(2\pi f'_{d,k}(t)+\theta'_k(t))}$$

where $$f_{d,k}(t) = \frac{V\cos\Phi_k(t)}{\lambda'} \quad \text{(Eqtn 24)}$$

in which $\lambda'$ is the wavelength of the CW signal, and $A'_k(t)$ and $\theta'_k(t)$ are the amplitude and the phase of the $k^{th}$ cluster in m'(t).

A virtual antenna array may be formed by sampling the received continuous wave signal m'(t) at t=0, $T_o, 2T_o, \ldots, (L-1)T_o$ where $1/T_o$ is the rate with which m'(t) is sampled and L is the number of virtual antenna elements. Using the output of the virtual array: m'(0), m'($T_o$), ..., m'((L-1)$T_o$), one can resolve the two CW Doppler frequencies with as little as L=4, by applying digital signal processing known as root-MUSIC in processor 903 during a fade with both forward and backward smoothing. Root-MUSIC is known in the art and described in G. Proakis and D. G. Manolakis, "Introduction to Digital Signal Processing," McMillan Publishing Company, New York, 1991, and an implementation with forward and backward smoothing is described in F. Haber and M. Zoltowski, "Spatial Spectrum Estimation in a Coherent Environment using an Array in motion," IEEE Trans. Antennas Propag., vol. AP-34, pp.301–310, March 1986. Forward smoothing is required in order to circumvent the incoherence condition while backward smoothing improves the resolution capability of root-MUSIC for a fixed value L.

Processor 903 may be a digital computer or digital signal processor programmed with one of the programs TEMP_MUSIC_2D (used to carry out two dimensional temporal processing of the input signal), TEMP_MUSIC_ARRAY (used for one dimensional temporal processing of the input signal), TEMP_MUSIC (used for one dimensional temporal processing of the input signal) and SPACE_MUSIC (used for one dimensional spatial processing) appearing in the microfiche appendix.

Root-MUSIC is a super-resolution technique which solves for the roots (zeros) of the Z-domain polynomial (Eqtn 25)

$$V=(Z)=v(1)+v(2)Z^{-1}+v(3)Z^{-2}$$

where [v(1) v(2) v(3)] is the eigen vector associated with the smallest eigen value of the 3×3 smoothed autocorrelation matrix for the sequence $$\{m'(lT_o)\}_{l=0}^{3}.$$

Both roots of V(Z) lie on the unit circle with a phase equal to the normalized CW Doppler frequencies. Thus, one can extract the two CW Doppler frequencies from the phases of the two roots of V(Z), which leads directly to the extraction of the data signal Doppler frequencies in mapper 904. The mapper 904 carries out the map function $f_{d,k}(t)=f'_{d,k}(t)\lambda'/\lambda$.

Once the data signal Doppler frequencies have been estimated using root-MUSIC, one can extract $m_1(t)$ from m(t) by placing a notch at the Doppler frequency $f_{d,2}(t)$ using an $M^{th}$ order notch filter 905 as shown in FIG. 13. The notch filter has a Z-domain transfer function H(Z) (Eqtn 27)

$$H(Z) = \prod_{m=1}^{M} (1-Z^{-1}Z_m)$$

where $$\{Z_m\}_{m=1}^{M}$$

are the M zeros of the notch filter. Theoretically, only one zero $Z_1$ is required in order to create a notch at $f_{d,2}(t)$. In this case, the zero is equal to $$Z_1 = e^{-j2\pi f_{d,2}(t)\tau_o}$$

where $1/\tau_o$ is the rate with which m(t) is sampled. The output y of the notch filter at time $t_o$ is (Eqtn 28)

$$y(t_o)=m(t_o)-m(t_o+\tau_o)Z_1$$

Based on A3, we have (Eqtn 29)

$$y(t_o)=m(t_o)e^{j2\pi(f_{d,1}(t_o+\tau_o)-f_{d,2}(t_o))\tau_o}$$

as long as $\tau_o \leq T/2$ in Eqtn 28. Based on A2, one can easily obtain $m_1(t_o)$ from Eqtn 29 since $(f_{d,1}(t_o+\tau_o)-f_{d,2}(t_o))\tau_o$ is a known value.

Similarly, one can extract $m_2(t)$ from m(t) by placing a notch filter at the Doppler frequency $f_{d,1}(t)$ using an $M^{th}$ order notch filter 906. Once the two clusters $m_1(t_0)$ and $m_2(t_0)$ have been separated from one another, the two separated clusters can then be combined in combiner 907 using any of various techniques, for example maximal selection combining, after taking into account the relative delay between clusters.

Figure 15:
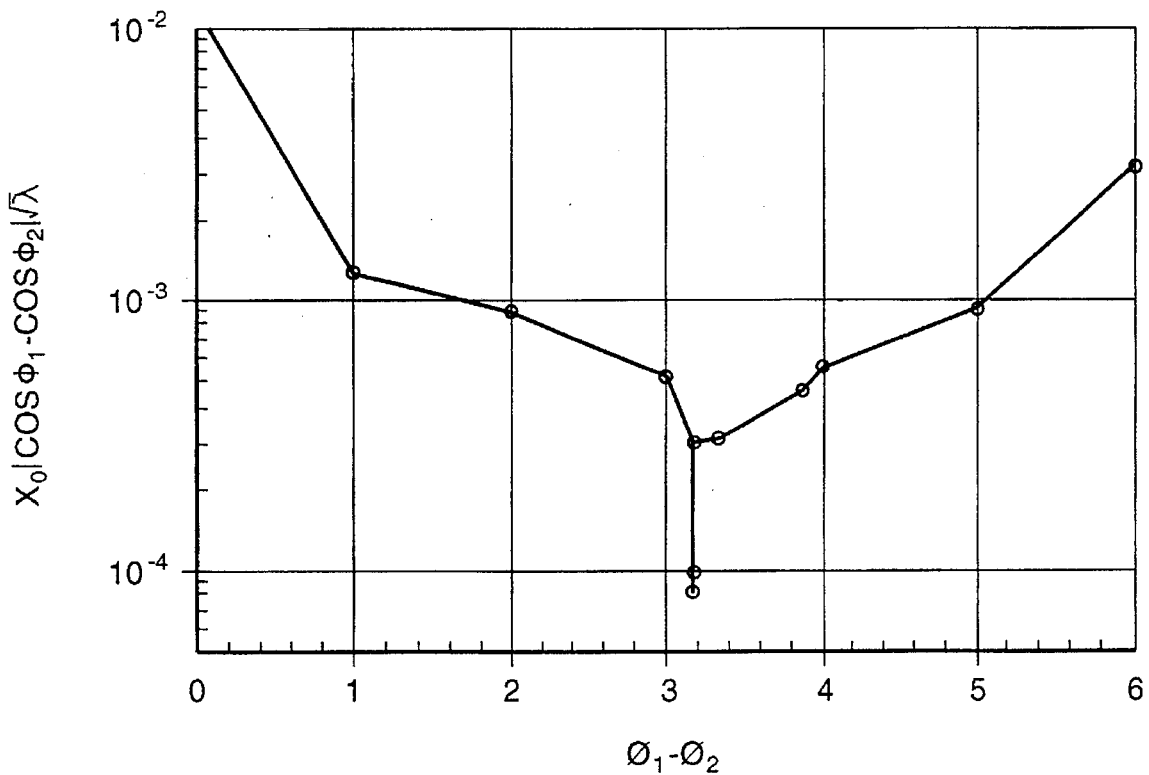
FIG. 15 shows a measure of the difference between two sinusoids being resolved by the method of the invention.

It is necessary to resolve the CW Doppler frequencies with an accuracy better than $$\frac{V\tau_o}{\lambda M} |\cos\phi_1(t) - \cos\phi_2(t)|$$

where M is the order of the notch filter. In order to ensure that the notch filter is effective, the narrowband condition has to be satisfied or equivalently $\tau_0 \leq T/2$. FIG. 15 displays $$\frac{V\tau_o}{\lambda M} |\cos\phi_1(t) - \cos\phi_2(t)|$$

versus $\theta'_1(t)-\theta'_2(t)$ using a single precision machine with $\tau_0=T/2$. FIG. 15 shows that application of root-MUSIC resolves the two CW Doppler frequencies with $$\frac{V\tau_o}{\lambda M} |\cos\phi_1(t) - \cos\phi_2(t)|$$

less than $10^{-4}$, implying that V has to be larger than (Eqtn 30)

$$\frac{2\lambda M 10^{-4}/T}{|\cos\phi_1(t) - \cos\phi_2(t)|}$$

that is (Eqtn 31)

$$V > \frac{6.12M}{|\cos\phi_1(t) - \cos\phi_2(t)|} \text{ Km/Hr.}$$

Thus, high accuracy in estimating the Doppler frequencies in a mobile environment can be achieved by applying root-MUSIC during a null (that is, during a fade). On the average, a null occurs every $\lambda/2$. From A2, one can therefore estimate the two Doppler frequencies with high accuracy every $\lambda/2$.

Figure 16:
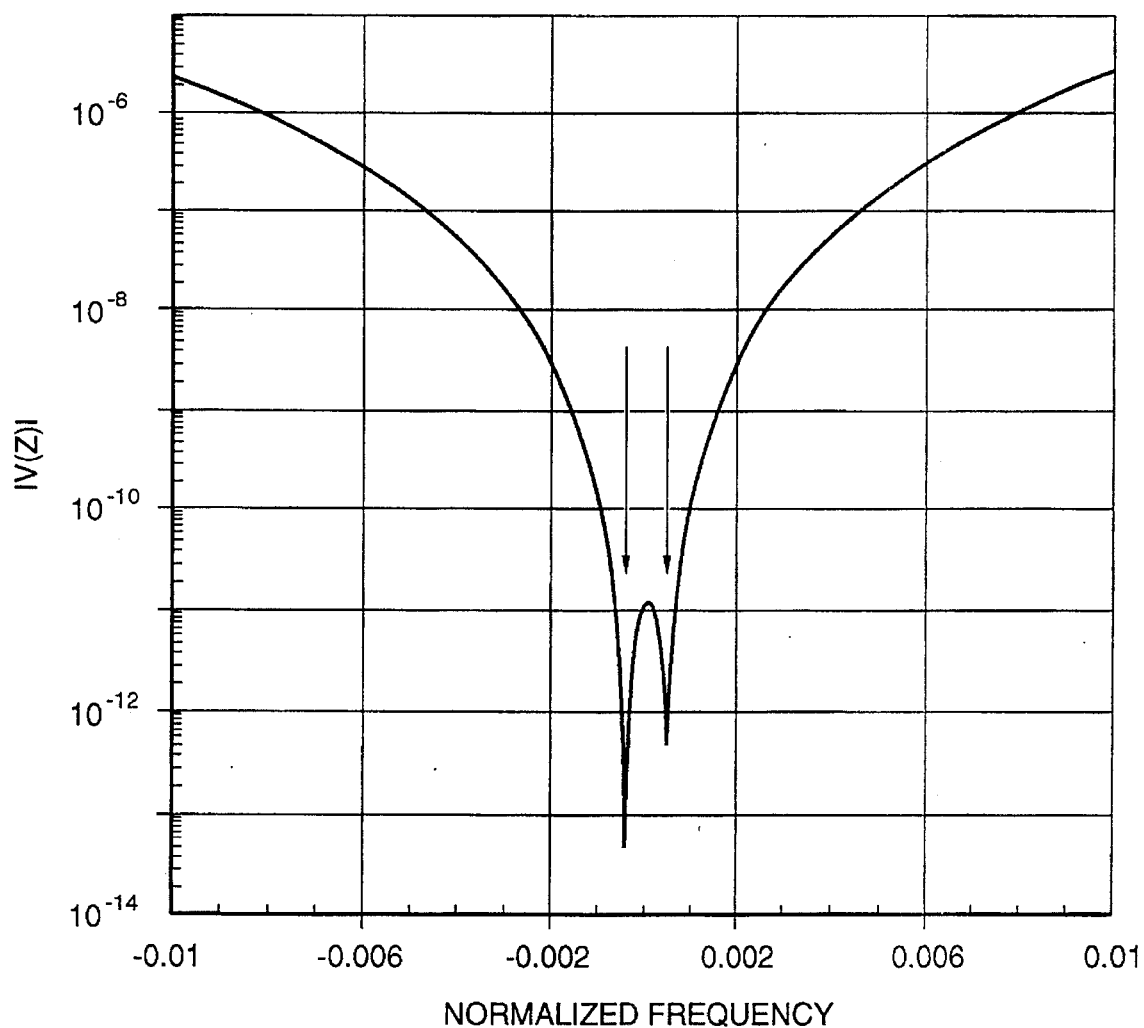
FIG. 16 shows a relationship between the MUSIC function and the frequency response of the received channel.

In applying root-Music, it is assumed that each cluster $m_k(t)$ consists of several rays all confined to the same angle of arrival. If the various components of $m_k(t)$ arrive within a non-zero bandwidth, a first order filter with one notch is not sufficient to cancel all the components contained in a cluster and higher order notch filters are required. FIG. 16 illustrates v(Z) (Eqtn 25) versus the normalized frequency $fT_0$, for the case when each cluster is assumed to consist of five components with a ±5° beamwidth. The first cluster is grouped around $\phi_1(t)=20°$. The second cluster is grouped around $\phi_2(t)=135°$. The two clusters have equal power. The arrows in FIG. 16 indicate the two normalized Doppler frequencies:

$$\frac{V\cos 20°}{\lambda} T_0 \text{ and } \frac{V\cos 135°}{\lambda} T_0$$

for V =75 Km/Hr and $T_O$ =10.3 µs. Once the two normalized Doppler frequencies have been estimated as shown in FIG. 16, notch filtering is used to separate the two clusters.

Figure 17A:
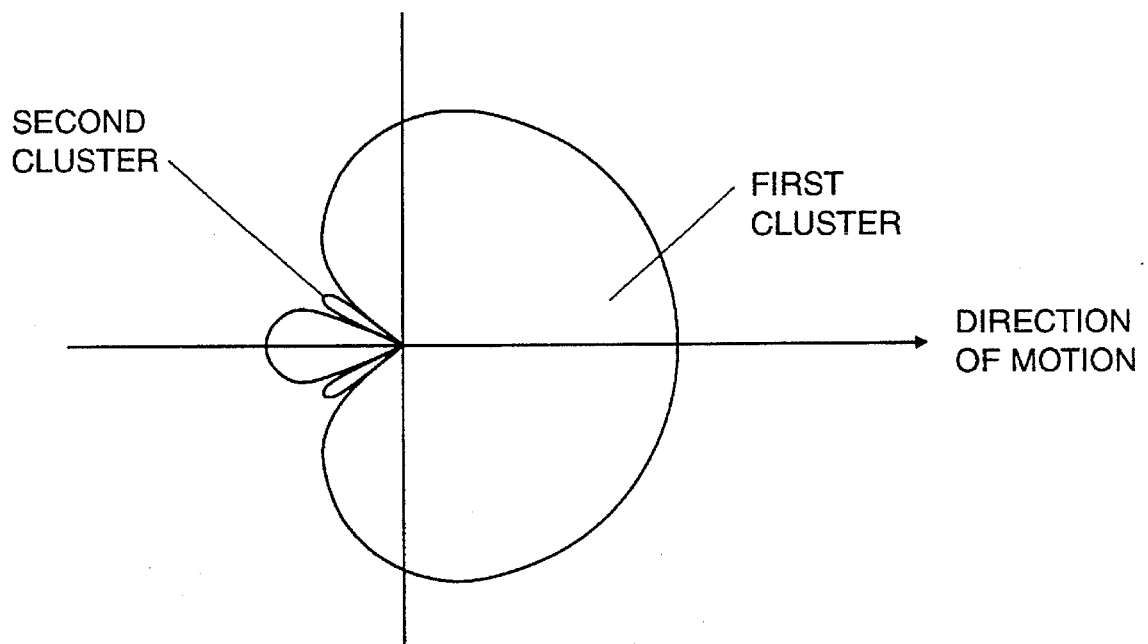
FIGS. 17(a) and 17(b) show respectively the removal of two separate clusters of received signals at a mobile.
Figure 17B:
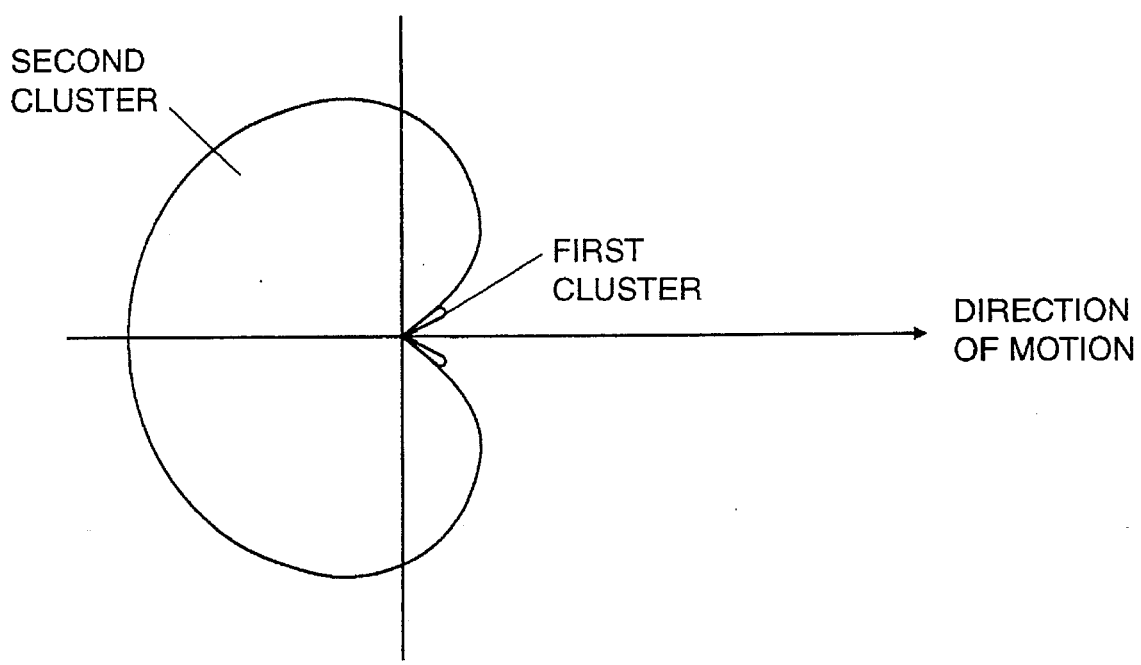

FIG. 17a displays the array pattern formed by a second order filter with one notch at $\phi_1(t)-5°$ and another at $\phi_1(t)+5°$, while FIG. 17b displays the array pattern formed by a second order filter with one notch at $\phi_2(t)-5°$ and another at $\phi_2(t)+5°$. Using the filters corresponding to FIG. 17a and 17b, the interference between the two clusters is reduced by up to 20 dB.

In general it is believed that the first arriving cluster $m_1(t)$ is due to reflections and diffractions off objects and other obstacles between the transmitter and the receiver, while the delayed cluster $m_2(t)$ is due to one major reflection off a distant reflector, e.g. a mountain or a high-rise building. Thus, $m_1(t)$ will likely have a larger beamwidth than $m_2(t)$. In this case, the root-MUSIC technique is applied in processor 903 to estimate $f_{d,2}(t)$. Notch filtering can then be used to separate $m_2(t)$ from m(t). Finally, $m_1(t)$ can be estimated as $m(t)-m_2(t)$.

If there is only one cluster, i.e. the channel is flat, the same technique as outlined in FIG. 13 may be used to obtain SNR diversity gain. This is achieved by using root-MUSIC to separate the two strongest arrivals from one another, followed by notch filtering around each arrival. Cochannel interference may also be reduced using the apparatus outlined in FIG. 13.

While any of various filter designs may be used in the processing of signals according to the invention, the program identified as Fil.C in the microfiche appendix may be used to filter any signal to any band according to some coefficients. The program Fildesin.C in the microfiche appendix may be used to generate the coefficients of a digital filter given the length of the filter and cut-off frequencies.

A person skilled in the art could make immaterial modifications to the invention described and claimed in this patent without departing from the essence of the invention.

The embodiment of the invention in which an exclusive property or privilege is claimed are defined as follows:

1. A method of transforming an input signal m(t) which is describable by a function M(z) having one or more fades corresponding to one or more complex zeroes $z_k$, for k=1, . . . N where N is the number of fades, the input signal m(t) having values during an interval between 0 and T, into a sequence of data points, the method comprising the steps of:

acquiring the input signal;

low pass equivalent filtering the input signal;

processing the filtered input signal in a signal processor to determine, for each fade, the location of the fade; and constructing a compressed signal at least partially formed of data points corresponding to the location of each fade.

2. The method of claim 1 in which processing the low pass equivalent of the input signal includes determining, for each fade, the depth of the fade.

3. The method of claim 2 further including storing the compressed signal as depth and location differentials.

4. The method of claim 1 or 2 in which determining the location of each fade includes:

differentiating the logarithm of the envelope of the input signal m(t) for t between 0 and T; and dividing the interval between 0 and T into subintervals, where each subinterval has a lower bound $t_{k,1}$ and an upper bound $t_{k,2}$, and each subinterval includes a fade.

5. The method of claim 4 in which:

the lower bound $t_{k,1}$ of each subinterval corresponds to the kth local minimum of the derivative of the logarithm of the envelope of the signal m(t);

the upper bound $t_{k,2}$ of each subinterval corresponds to the kth local maximum of the derivative of the logarithm of the envelope of the signal m(t); and the product of (1) the kth local minimum of the derivative of the logarithm of the envelope of the signal m(t) and (2) the kth local maximum of the derivative of the logarithm of the envelope of the signal m(t) is negative.

6. The method of claim 5 in which the location $t_{k,0}$ of the kth fade for k=1, . . . , N is estimated as $$\hat{t}_{k,0}=(t_{k,1}-t_{k,2})/2.$$

7. The method of claim 6 in which the depth of the kth fade for k=1, . . . , N is estimated as $$\hat{\alpha}_k=1+\tfrac{1}{2}(\omega\hat{t}_{k,0})^2\pm(\omega\hat{t}_{k,0})\sqrt{(1+\tfrac{1}{4}(\omega\hat{t}_{k,0})^2)},$$

where $\omega=2\pi/T$.

8. The method of claim 2 in which the depth and location of each fade are determined by:

taking a Fourier transform of the signal to produce data points corresponding to the Fourier coefficients of the signal;

forming a polynomial using the Fourier coefficients of the signal;

factorizing the polynomial to produce the roots of the polynomial; and deriving the location and the depth of each fade from the roots of the polynomial.

9. The method of claims 1 or 2 further including, after acquiring the input signal:

forming a derivative signal corresponding to a derivative of the low pass equivalent of the input signal.

10. The method of claim 9 further including:

constructing an expanded polynomial whose roots correspond to the locations of the fades of the input signal; and estimating the spectrum of the input signal as the coefficients of the expanded polynomial.

11. The method of claim 10 in which the expanded polynomial is constructed in a recursive manner continuously while the input signal is being acquired.

12. The method of claims 1 or 2 in which the input signal is a speech signal and further including:

quantizing the compressed signal and transmitting the quantized compressed signal.

13. The method of claims 1 or 2 in which the input signal is a speech signal having voiced and unvoiced segments and further including:

quantizing segments of the compressed signal according to whether the segment is voiced or unvoiced, and transmitting the quantized compressed signal.

14. The method of claim 1 in which the input signal is formed by at least first and second sinusoids of different frequencies, and further including resolving the first and second sinusoids of different frequencies by applying a spectral estimation technique to the input signal in the neighbourhood of one of the N fades.

15. The method of claim 14 further including:

applying a first notch filter centered on the first frequency to m(t) to produce a signal $m(t)_1$;

applying a second notch filter centered on the second frequency to m(t) to produce a signal $m(t)_2$; and combining the signals $m(t)_1$ and $m(t)_2$.

16. The method of claim 1 further including further processing the compressed signal to calculate the difference in location of successive fades, whereby a phase differential of the input signal may be estimated.

17. The method of claim 1 in which the input signal is a speech signal.

18. The method of claim 1 in which the input signal is data encoded in an electromagnetic signal and further including modulating a carrier signal with the compressed signal for transmission of the carrier signal over a communications channel.

19. The method of claim 1 in which the input signal has an envelope with inphase and quadrature components and acquiring the input signal includes sampling the inphase and quadrature components of the envelope of the input signal.

20. The method of claim 1 in which the input signal is formed by at least first and second replicas of the same signal, and further including resolving the first and second replicas of the same signal by applying a spectral estimation technique to the input signal.

21. Apparatus for processing an input signal comprising:

input signal acquisition means having a first output signal;

a low pass equivalent filter connected to receive the output from the input signal acquisition means and having filtered output; and processing means connected to receive the filtered output for locating the fades of the input signal and constructing a compressed signal comprising the locations of the fades.

22. The apparatus of claim 21 in which the processor includes means to quantize the compressed signal.

23. The apparatus of claim 22 further including a transmitter connected to the processing means.

24. The apparatus of claim 23 further including:

an encoder connected to receive the compressed signal for encoding a carrier signal for transmission.

25. The apparatus of claim 24 in which the input signal is a speech signal and further including a transducer having electrical output corresponding to the speech signal.

26. The apparatus of claim 21 in which the processor includes means to determine the depth of each fade.

27. The apparatus of claims 21 or 26 in which the processor includes means to differentiate the first output signal.

28. The apparatus of claim 27 further including means to estimate the spectrum of the input signal.

29. The apparatus of claim 21 in which the input signal is composed of first and second signals having first and second distinct frequencies and further including:

first and second notch filters having notches at the first and second distinct frequencies and each being connected to receive the compressed signal; and means to combine outputs from the first and second notch filters.

30. The apparatus of claim 18 in which the processor includes means to calculate the difference in locations of successive fades.

31. The apparatus of claim 21 in which the input signal is a speech signal and the signal acquisition means includes a transducer having electrical output corresponding to the speech signal.

32. The apparatus of claim 21 in which the input signal has an envelope with inphase and quadrature components and the input signal acquisition means includes a sampler having output corresponding to inphase and quadrature components of the envelope of the input signal.

33. The apparatus of claim 21 in which the input signal acquisition means includes a band pass filter.

34. The apparatus of claim 21 in which the input signal is composed of first and second delayed replicas of a transmitted signal and further including:

a spectral estimator to resolve the delay of each replica; and means to regenerate the transmitted signal from the delayed replicas.

35. A vocoder for encoding a speech signal for transmission, the vocoder comprising:

a first transducer having electrical output corresponding to the speech signal;

a bandpass filter connected to receive electrical output from the transducer and having filtered output;

processing means connected to receive the filtered output from the bandpass filter and having compressed signal output at least in part corresponding to the locations of the fades of the input signal; and an encoder for encoding a carrier signal with the compressed signal output.

36. The vocoder of claim 35 in which the processing means includes an analog to digital converter for digitizing the filtered output from the bandpass filter.

37. The vocoder of claim 36 in which the processing means includes a segmentizer connected to receive digitized signals from the analog to digital converter and having output corresponding to segments of digitized speech.

38. The vocoder of claim 35 in which the processing means includes means to quantize the compressed signal output.

39. The vocoder of claim 35 further including:

a decoder for decoding the carrier signal to obtain the compressed signal;

a deprocessor having output corresponding to a reconstructed speech signal reconstructed from the compressed signal; and a second transducer for producing acoustic signals from the reconstructed speech signal.

40. A system for reducing noise in an input electromagnetic signal having an envelope, the system comprising:

signal acquisition means having electrical signal output corresponding to an estimate of the envelope of the input electromagnetic signal;

a bandpass filter connected to receive the electrical signal output from the signal acquisition means and having filtered output;

a phase differential estimator connected to receive the filtered output from the bandpass filter and having output comprising phase differentials estimated using the locations of the fades; and an encoder having as input both the phase differentials and the filtered output, and having encoded output for transmission.

* * * * *